United States Patent
Zhang et al.

(10) Patent No.: US 7,838,133 B2
(45) Date of Patent: Nov. 23, 2010

(54) DEPOSITION OF PEROVSKITE AND OTHER COMPOUND CERAMIC FILMS FOR DIELECTRIC APPLICATIONS

(75) Inventors: Hongmei Zhang, San Jose, CA (US); Richard E. Demaray, Portola Valley, CA (US)

(73) Assignee: SpringWorks, LLC, Minnetonka, MN (US)

( * ) Notice: Subject to any disclaimer, the term of this patent is extended or adjusted under 35 U.S.C. 154(b) by 447 days.

(21) Appl. No.: 11/218,652

(22) Filed: Sep. 2, 2005

(65) Prior Publication Data

US 2007/0053139 A1    Mar. 8, 2007

(51) Int. Cl.
- B32B 15/04 (2006.01)
- B32B 9/00 (2006.01)
- C23C 14/34 (2006.01)
- B05D 5/12 (2006.01)

(52) U.S. Cl. ............ 428/701; 204/192.12; 204/192.15; 204/192.22

(58) Field of Classification Search .......... None
See application file for complete search history.

(56) References Cited

U.S. PATENT DOCUMENTS

| | | | |
|---|---|---|---|
| 3,309,302 A | 3/1967 | Heil | |
| 3,616,403 A | 10/1971 | Collins et al. | |
| 3,850,604 A | 11/1974 | Klein | |
| 4,006,070 A | 2/1977 | King et al. | |
| 4,082,569 A | 4/1978 | Evans, Jr. | |
| 4,099,091 A | 7/1978 | Yamazoe et al. | |
| 4,111,523 A | 9/1978 | Kaminow et al. | |
| 4,437,966 A | 3/1984 | Hope et al. | |
| 4,587,225 A | 5/1986 | Tsukuma et al. | |
| 4,619,680 A | 10/1986 | Nourshargh et al. | |
| RE32,449 E | 6/1987 | Claussen | |
| 4,915,810 A | 4/1990 | Kestigian et al. | |
| 4,978,437 A | 12/1990 | Wirz | |
| 5,085,904 A | 2/1992 | Deak et al. | |
| 5,107,538 A | 4/1992 | Benton et al. | |
| 5,110,696 A | 5/1992 | Shokoohi et al. | |

(Continued)

FOREIGN PATENT DOCUMENTS

EP    0 510 883 A2    10/1992

(Continued)

OTHER PUBLICATIONS

Belkind, A. et al., "Pulsed-DC Reactive Sputtering of Dielectrics: Pulsing Parameter Effects," 43rd Annual Technical Conference Proceedings-Denver: 86-90 (Apr. 15-20, 2000).

(Continued)

Primary Examiner—Aaron Austin
(74) Attorney, Agent, or Firm—Haynes and Boone, LLP

(57) ABSTRACT

In accordance with the present invention, deposition of perovskite material, for example barium strontium titanite (BST) film, by a pulsed-dc physical vapor deposition process or by an RF sputtering process is presented. Such a deposition can provide a high deposition rate deposition of a layer of perovskite. Some embodiments of the deposition address the need for high rate deposition of perovskite films, which can be utilized as a dielectric layer in capacitors, other energy storing devices and micro-electronic applications. Embodiments of the process according to the present invention can eliminate the high temperature (>700° C.) anneal step that is conventionally needed to crystallize the BST layer.

26 Claims, 8 Drawing Sheets

| SECOND ELECTRODE | ~304 |
|---|---|
| PEROVSKITE | ~302 |
| FIRST ELECTRODE | ~303 |
| SUBSTRATE | ~301 |

U.S. PATENT DOCUMENTS

| | | | |
|---|---|---|---|
| 5,119,460 A | 6/1992 | Bruce et al. | |
| 5,141,603 A * | 8/1992 | Dickey et al. | 205/124 |
| 5,173,271 A | 12/1992 | Chen et al. | |
| 5,174,876 A | 12/1992 | Buchal et al. | |
| 5,196,041 A | 3/1993 | Tumminelli et al. | |
| 5,200,029 A | 4/1993 | Bruce et al. | |
| 5,206,925 A | 4/1993 | Nakazawa et al. | |
| 5,225,288 A | 7/1993 | Beeson et al. | |
| 5,237,439 A | 8/1993 | Misono et al. | |
| 5,252,194 A | 10/1993 | Demaray et al. | |
| 5,287,427 A | 2/1994 | Atkins et al. | |
| 5,296,089 A | 3/1994 | Chen et al. | |
| 5,303,319 A | 4/1994 | Ford et al. | |
| 5,306,569 A | 4/1994 | Hiraki | |
| 5,309,302 A | 5/1994 | Vollmann | |
| 5,338,625 A | 8/1994 | Bates et al. | |
| 5,355,089 A | 10/1994 | Treger | |
| 5,362,672 A | 11/1994 | Ohmi et al. | |
| 5,381,262 A | 1/1995 | Arima et al. | |
| 5,427,669 A | 6/1995 | Drummond | |
| 5,435,826 A | 7/1995 | Sakakibara et al. | |
| 5,457,569 A | 10/1995 | Liou et al. | |
| 5,472,795 A | 12/1995 | Atita | |
| 5,475,528 A | 12/1995 | LaBorde | |
| 5,478,456 A | 12/1995 | Humpal et al. | |
| 5,483,613 A | 1/1996 | Bruce et al. | |
| 5,499,207 A | 3/1996 | Miki et al. | |
| 5,507,930 A | 4/1996 | Yamashita et al. | |
| 5,512,147 A | 4/1996 | Bates et al. | |
| 5,538,796 A | 7/1996 | Schaffer et al. | |
| 5,555,127 A | 9/1996 | Abdelkader et al. | |
| 5,561,004 A | 10/1996 | Bates et al. | |
| 5,563,979 A | 10/1996 | Bruce et al. | |
| 5,565,071 A | 10/1996 | Demaray et al. | |
| 5,569,520 A | 10/1996 | Bates | |
| 5,591,520 A | 1/1997 | Migliorini et al. | |
| 5,597,660 A | 1/1997 | Bates et al. | |
| 5,603,816 A | 2/1997 | Demaray et al. | |
| 5,607,560 A | 3/1997 | Hirabayashi et al. | |
| 5,607,789 A | 3/1997 | Treger et al. | |
| 5,612,152 A | 3/1997 | Bates | |
| 5,613,995 A | 3/1997 | Bhandarkar et al. | |
| 5,645,626 A | 7/1997 | Edlund et al. | |
| 5,654,054 A | 8/1997 | Tropsha et al. | |
| 5,654,984 A | 8/1997 | Hershbarger et al. | |
| 5,660,700 A | 8/1997 | Shimizu et al. | |
| 5,681,671 A | 10/1997 | Orita et al. | |
| 5,686,360 A | 11/1997 | Harvey, III et al. | |
| 5,689,522 A | 11/1997 | Beach | |
| 5,693,956 A | 12/1997 | Shi et al. | |
| 5,718,813 A | 2/1998 | Drummond | |
| 5,719,976 A | 2/1998 | Henry et al. | |
| 5,731,661 A | 3/1998 | So et al. | |
| 5,738,731 A | 4/1998 | Shindo et al. | |
| 5,755,938 A | 5/1998 | Fukui et al. | |
| 5,757,126 A | 5/1998 | Harvey, III et al. | |
| 5,762,768 A | 6/1998 | Goy et al. | |
| 5,771,562 A | 6/1998 | Harvey, III et al. | |
| 5,789,071 A | 8/1998 | Sproul et al. | |
| 5,792,550 A | 8/1998 | Phillips et al. | |
| 5,811,177 A | 9/1998 | Shi et al. | |
| 5,814,195 A | 9/1998 | Lehan et al. | |
| 5,830,330 A | 11/1998 | Lantsman | |
| 5,831,262 A | 11/1998 | Greywall et al. | |
| 5,841,931 A | 11/1998 | Foresi et al. | |
| 5,847,865 A | 12/1998 | Gopinath et al. | |
| 5,849,163 A | 12/1998 | Ichikawa et al. | |
| 5,853,830 A | 12/1998 | McCaulley et al. | |
| 5,855,744 A | 1/1999 | Halsey et al. | |
| 5,870,273 A | 2/1999 | Sogabe et al. | |
| 5,882,946 A | 3/1999 | Otani | |
| 5,900,057 A | 5/1999 | Buchal et al. | |
| 5,909,346 A | 6/1999 | Malhotra et al. | |
| 5,930,584 A | 7/1999 | Sun et al. | |
| 5,942,089 A | 8/1999 | Sproul et al. | |
| 5,948,215 A | 9/1999 | Lantsman | |
| 5,952,778 A | 9/1999 | Haskal et al. | |
| 5,961,682 A | 10/1999 | Lee et al. | |
| 5,966,491 A | 10/1999 | DiGiovanni | |
| 5,977,582 A | 11/1999 | Fleming et al. | |
| 6,001,224 A | 12/1999 | Drummond et al. | |
| 6,004,660 A | 12/1999 | Topolski et al. | |
| 6,024,844 A | 2/2000 | Drummond et al. | |
| 6,045,626 A | 4/2000 | Yano et al. | |
| 6,046,081 A | 4/2000 | Kuo | |
| 6,051,114 A | 4/2000 | Yao et al. | |
| 6,051,296 A | 4/2000 | McCaulley et al. | |
| 6,052,397 A | 4/2000 | Jeon et al. | |
| 6,057,557 A | 5/2000 | Ichikawa | |
| 6,058,233 A | 5/2000 | Dragone | |
| 6,071,323 A | 6/2000 | Kawaguchi | |
| 6,077,642 A | 6/2000 | Ogata et al. | |
| 6,080,643 A | 6/2000 | Noguchi et al. | |
| 6,093,944 A | 7/2000 | VanDover | |
| 6,106,933 A | 8/2000 | Nagai et al. | |
| 6,117,238 A * | 9/2000 | Begin | 118/500 |
| 6,117,279 A | 9/2000 | Smolanoff et al. | |
| 6,117,345 A | 9/2000 | Liu et al. | |
| 6,146,225 A | 11/2000 | Sheats et al. | |
| 6,154,582 A | 11/2000 | Bazylenko et al. | |
| 6,157,765 A | 12/2000 | Bruce et al. | |
| 6,162,709 A | 12/2000 | Raoux et al. | |
| 6,165,566 A | 12/2000 | Tropsha | |
| 6,168,884 B1 | 1/2001 | Neudecker et al. | |
| 6,176,986 B1 | 1/2001 | Watanabe et al. | |
| 6,197,167 B1 | 3/2001 | Tanaka | |
| 6,198,217 B1 | 3/2001 | Suzuki et al. | |
| 6,204,111 B1 | 3/2001 | Uemoto et al. | |
| 6,210,544 B1 | 4/2001 | Sasaki | |
| 6,214,660 B1 | 4/2001 | Uemoto et al. | |
| 6,232,242 B1 | 5/2001 | Hata et al. | |
| 6,242,129 B1 | 6/2001 | Johnson | |
| 6,242,132 B1 | 6/2001 | Neudecker et al. | |
| 6,248,291 B1 | 6/2001 | Nakagama et al. | |
| 6,248,640 B1 | 6/2001 | Nam | |
| 6,261,917 B1 | 7/2001 | Quek et al. | |
| 6,280,585 B1 | 8/2001 | Obinata et al. | |
| 6,280,875 B1 | 8/2001 | Kwak et al. | |
| 6,281,142 B1 | 8/2001 | Basceri et al. | |
| 6,287,986 B1 | 9/2001 | Mihara | |
| 6,290,821 B1 | 9/2001 | McLeod | |
| 6,290,822 B1 | 9/2001 | Fleming et al. | |
| 6,300,215 B1 | 10/2001 | Shin | |
| 6,302,939 B1 | 10/2001 | Rabin et al. | |
| 6,306,265 B1 | 10/2001 | Fu et al. | |
| 6,344,413 B1 * | 2/2002 | Zurcher et al. | 438/678 |
| 6,344,419 B1 | 2/2002 | Forster et al. | |
| 6,350,353 B2 | 2/2002 | Gopalraja et al. | |
| 6,358,810 B1 | 3/2002 | Dornfest et al. | |
| 6,361,662 B1 | 3/2002 | Chiba et al. | |
| 6,365,300 B1 | 4/2002 | Ota et al. | |
| 6,365,319 B1 | 4/2002 | Heath et al. | |
| 6,372,098 B1 * | 4/2002 | Newcomb et al. | 204/192.12 |
| 6,376,027 B1 | 4/2002 | Lee et al. | |
| 6,379,835 B1 | 4/2002 | Kucherovsky et al. | |
| 6,391,166 B1 | 5/2002 | Wang | |
| 6,409,965 B1 | 6/2002 | Nagata et al. | |
| 6,413,382 B1 | 7/2002 | Wang et al. | |
| 6,413,645 B1 | 7/2002 | Graff et al. | |
| 6,416,598 B1 | 7/2002 | Sircar | |
| 6,423,776 B1 | 7/2002 | Akkapeddi et al. | |
| 6,433,380 B2 | 8/2002 | Shin | |
| 6,444,104 B2 | 9/2002 | Gopalraja et al. | |
| 6,444,750 B1 | 9/2002 | Touhsaent | |

| | | | |
|---|---|---|---|
| 6,488,822 B1 | 12/2002 | Moslehi | |
| 6,506,289 B2 | 1/2003 | Demaray et al. | |
| 6,511,615 B1 | 1/2003 | Dawes et al. | |
| 6,533,907 B2 | 3/2003 | Demaray et al. | |
| 6,537,428 B1 | 3/2003 | Xiong et al. | |
| 6,558,836 B1 | 5/2003 | Whitacre et al. | |
| 6,563,998 B1 | 5/2003 | Farah et al. | |
| 6,576,546 B2 | 6/2003 | Gilbert et al. | |
| 6,578,891 B1 * | 6/2003 | Suzuki et al. | 294/64.1 |
| 6,602,338 B2 | 8/2003 | Chen et al. | |
| 6,605,228 B1 | 8/2003 | Kawaguchi et al. | |
| 6,615,614 B1 | 9/2003 | Makikawa et al. | |
| 6,632,563 B1 | 10/2003 | Krasnov et al. | |
| 6,641,704 B2 | 11/2003 | Someno | |
| 6,673,716 B1 | 1/2004 | D'Couto et al. | |
| 6,750,156 B2 | 6/2004 | Le et al. | |
| 6,764,525 B1 | 7/2004 | Whitacre et al. | |
| 6,818,356 B1 | 11/2004 | Bates | |
| 6,827,826 B2 | 12/2004 | Demaray et al. | |
| 6,846,765 B2 | 1/2005 | Imamura et al. | |
| 6,849,165 B2 | 2/2005 | Kloppel et al. | |
| 7,262,131 B2 | 8/2007 | Narasimhan et al. | |
| 7,378,356 B2 | 5/2008 | Zhang et al. | |
| 7,381,657 B2 | 6/2008 | Zhang et al. | |
| 7,404,877 B2 | 7/2008 | Demaray et al. | |
| 7,413,998 B2 | 8/2008 | Zhang et al. | |
| 7,544,276 B2 | 6/2009 | Zhang et al. | |
| 2001/0027159 A1 | 10/2001 | Kaneyoshi | |
| 2001/0034106 A1 | 10/2001 | Moise et al. | |
| 2001/0041460 A1 | 11/2001 | Wiggins | |
| 2001/0050223 A1 | 12/2001 | Gopalraja et al. | |
| 2002/0001746 A1 | 1/2002 | Jenson | |
| 2002/0009630 A1 | 1/2002 | Gao et al. | |
| 2002/0033330 A1 | 3/2002 | Demaray et al. | |
| 2002/0076133 A1 | 6/2002 | Li et al. | |
| 2002/0106297 A1 | 8/2002 | Ueno et al. | |
| 2002/0115252 A1 | 8/2002 | Haukka et al. | |
| 2002/0134671 A1 | 9/2002 | Demaray et al. | |
| 2002/0140103 A1 | 10/2002 | Kloster et al. | |
| 2002/0170821 A1 | 11/2002 | Sandlin et al. | |
| 2003/0019326 A1 | 1/2003 | Han et al. | |
| 2003/0022487 A1 | 1/2003 | Yoon et al. | |
| 2003/0035906 A1 | 2/2003 | Memarian et al. | |
| 2003/0042131 A1 | 3/2003 | Johnson | |
| 2003/0063883 A1 | 4/2003 | Demaray et al. | |
| 2003/0077914 A1 | 4/2003 | Le et al. | |
| 2003/0079838 A1 | 5/2003 | Brcka | |
| 2003/0097858 A1 | 5/2003 | Strohhofer et al. | |
| 2003/0127319 A1 | 7/2003 | Demaray et al. | |
| 2003/0134054 A1 | 7/2003 | Demaray et al. | |
| 2003/0141186 A1 | 7/2003 | Wang et al. | |
| 2003/0143853 A1 | 7/2003 | Celii et al. | |
| 2003/0173207 A1 | 9/2003 | Zhang et al. | |
| 2003/0173208 A1 | 9/2003 | Pan et al. | |
| 2003/0174391 A1 | 9/2003 | Pan et al. | |
| 2003/0175142 A1 | 9/2003 | Milonopoulou et al. | |
| 2003/0234835 A1 * | 12/2003 | Torii et al. | 347/68 |
| 2004/0043557 A1 | 3/2004 | Haukka et al. | |
| 2004/0077161 A1 | 4/2004 | Chen et al. | |
| 2004/0105644 A1 | 6/2004 | Dawes | |
| 2004/0245561 A1 | 12/2004 | Sakashita et al. | |
| 2004/0259305 A1 | 12/2004 | Demaray et al. | |
| 2005/0000794 A1 | 1/2005 | Demaray et al. | |
| 2005/0006768 A1 | 1/2005 | Narasimhan et al. | |
| 2005/0048802 A1 | 3/2005 | Zhang et al. | |
| 2006/0054496 A1 | 3/2006 | Zhang et al. | |
| 2006/0057283 A1 | 3/2006 | Zhang et al. | |
| 2006/0057304 A1 | 3/2006 | Zhang et al. | |
| 2006/0071592 A1 | 4/2006 | Narasimhan et al. | |
| 2006/0134522 A1 | 6/2006 | Zhang et al. | |
| 2007/0172681 A1 | 7/2007 | Demaray et al. | |

FOREIGN PATENT DOCUMENTS

| | | |
|---|---|---|
| EP | 0 639 655 A1 | 2/1995 |
| EP | 0 652 308 A2 | 5/1995 |
| EP | 0 820 088 A2 | 1/1998 |
| EP | 1 068 899 A1 | 1/2001 |
| EP | 0 867 985 B1 | 2/2001 |
| EP | 1 092 689 A1 | 4/2001 |
| EP | 1 189 080 A2 | 3/2002 |
| JP | 61-60803 | 3/1986 |
| JP | 62-287071 | 12/1987 |
| JP | 2-054764 A2 | 2/1990 |
| JP | 6-010127 A | 1/1994 |
| JP | 6-100333 A | 4/1994 |
| JP | 7-233469 A | 5/1995 |
| WO | WO 96/23085 A1 | 8/1996 |
| WO | WO 97/35044 A1 | 9/1997 |
| WO | WO 00/21898 A1 | 4/2000 |
| WO | WO 00/22742 A2 | 4/2000 |
| WO | WO 00/36665 A1 | 6/2000 |
| WO | WO 01/86731 | 11/2001 |
| WO | WO 02/12932 A2 | 2/2002 |
| WO | WO 2004/021532 A1 | 3/2004 |
| WO | WO 2004/077519 A2 | 9/2004 |
| WO | WO 2004/106581 A2 | 12/2004 |
| WO | WO 2004/106582 A2 | 12/2004 |
| WO | WO 2006/063308 A2 | 6/2006 |
| WO | WO 2007/027535 A2 | 3/2007 |

OTHER PUBLICATIONS

Scholl, R., "Power Supplies for Pulsed Plasma Technologies: State-Of-The-Art And Outlook," Advances Energy Industries, Inc., pp. 1-8 (1999).

Scholl, R., "Power Systems for Reactive Sputtering of Insulating Films," Advances Energy Industries, Inc., pp. 1-8 (Aug. 2001).

Office Action dated Dec. 1, 2006, in U.S. Appl. No. 10/291,179.

Response to Office Action and Terminal Disclaimer dated Mar. 1, 2007, in U.S. Appl. No. 10/291,179.

Response to Office Action dated Feb. 6, 2007, in U.S. Appl. No. 10/101,863.

Response to Office Action dated Dec. 6, 2006, in U.S. Appl. No. 10/954,182.

Office Action dated Mar. 14, 2007, in U.S. Appl. No. 10/954,182.

Supplemental Preliminary Amendment dated Feb. 6, 2007, in U.S. Appl. No. 11/228,834.

Supplemental Preliminary Amendment dated Feb. 6, 2007, in U.S. Appl. No. 11/191,643.

Notice of Allowance dated Feb. 21, 2007, in U.S. Appl. No. 10/789,953.

Response to Office Action dated Dec. 21, 2006, in U.S. Appl. No. 11/228,805.

Response to Office Action dated Nov. 8, 2006, to the Korean Patent Office in Application No. 10-2005-7016055.

Response to Office Action dated Jan. 26, 2007, in U.S. Appl. No. 10/851,542.

Notice of Allowance dated Feb. 22, 2007, in U.S. Appl. No. 10/851,542.

Supplemental Notice of Allowance dated Mar. 15, 2007, in U.S. Appl. No. 10/851,542.

Application filed Mar. 22, 2007.

Preliminary Amendment dated Jul. 21, 2006, in U.S. Appl. No. 11/297,057.

Supplemental Preliminary Amendment, Substitute Specification with Markings, Substitute Specification without Markings, and Replacement Drawing Sheets dated Dec. 6, 2006 in U.S. Appl. No. 11/297,057.

Continuation application and Preliminary Amendment dated Dec. 13, 2006.

Kelly, P.J. et al., "A novel technique for the deposition of aluminum-doped zinc oxide films," Thin Solid Films 426(1-2):111-116 (2003).

Kim, H-K. & Yoon, Y., "Characteristics of rapid-thermal-annealed LiCoO2 cathode film for an all-solid-state thin film microbattery," J. Vac. Sci. Technol. A 22(4):1182-1187 (2004).

Snoeks, E. et al., "Cooperative upconversion in erbium-implanted soda-lime silicate glass optical waveguides," J. Opt. Soc. Am. B 12(8):1468-1474 (1995).

Tomaszewski, H. et al., "Yttria-stabilized zirconia thin films grown by reactive r.f. magnetron sputtering," Thin Solid Films 287:104-109 (1996).

Response to Office Action filed on Oct. 17, 2005 in U.S. Appl. No. 10/291,179.

Final Office Action issued on Dec. 14, 2005 in U.S. Appl. No. 10/291,179.

Response to Final Office Action filed Apr. 14, 2006, in U.S. Appl. No. 10/291,179.

Office Action mailed Apr. 27, 2006, in U.S. Appl. No. 10/291,179.

Response to Office Action filed Jul. 27, 2006, in U.S. Appl. No. 10/291,179.

Final Office Action dated Oct. 12, 2006, in U.S. Appl. No. 10/291,179.

Response to Final Office Action mailed Nov. 3, 2006, in U.S. Appl. No. 10/291,179.

Office Action issued Nov. 28, 2001, for US Patent No. 6,506,289.

Response to Office Action filed Feb. 20, 2002, for US Patent No. 6,506,289.

Office Action issued Apr. 17, 2002, for US Patent No. 6,506,289.

Response to Office Action filed Jul. 17, 2002, for US Patent No. 6,506,289.

Notice of Allowance mailed Aug. 6, 2002, for US Patent No. 6,506,289.

Ex parte Quayle Action mailed Nov. 10, 2003 for US Patent No. 6,827,826.

Notice of Allowance mailed Mar. 25, 2004 for US Patent No. 6,827,826.

PCT Invitation to Pay Additional Fees for PCT/US01/22750, dated Mar. 13, 2002.

PCT International Search Report for PCT/US01/22750, dated Jul. 19, 2002.

PCT Written Opinion for PCT/US01/22750, dated Jul. 23, 2002.

PCT International Preliminary Examination Report for PCT/US01/22750, dated Oct. 8, 2002.

Notice of Allowance issued on Oct. 8, 2002, in U.S. Patent No. 6,533,907.

Response to Office Action filed Dec. 5, 2005, U.S. Appl. No. 10/101,863.

Final Office Action issued on Feb. 14, 2006, in U.S. Appl. No. 10/101,863.

Response to Office Action filed Feb. 24, 2006, in U.S. Appl. No. 10/101,863.

Office Action mailed Mar. 22, 2006, in U.S. Appl. No. 10/101,863.

Response to Office Action filed Jun. 12, 2006, in U.S. Appl. No. 10/101,863.

Office Action mailed Sep. 6, 2006, in U.S. Appl. No. 10/101,863.

Response to Office Action filed on Jul. 25, 2005 in U.S. Appl. No. 10/954,182.

Response to Office Action filed on Dec. 21, 2005 in U.S. Appl. No. 10/954,182.

Office Action issued on Mar. 9, 2006, in U.S. Appl. No. 10/954,182.

Response to Office Action filed on Aug. 9, 2006 in U.S. Appl. No. 10/954,182.

Office Action dated Oct. 31, 2006, in U.S. Appl. No. 10/954,182.

Office Action issued on Dec. 2, 2005 in U.S. Appl. No. 10/789,953.

Response to Office Action filed Mar. 2, 2006 in U.S. Appl. No. 10/789,953.

Final Office Action issued on May 19, 2006 in U.S. Appl. No. 10/789,953.

Response to Final Office Action filed Aug. 3, 2006, in U.S. Appl. No. 10/789,953.

Notice of Allowance mailed Oct. 23, 2006, in U.S. Appl. No. 10/789,953.

Office Action dated Oct. 12, 2006, for U.S. Appl. No. 11/228,805.

Office Action dated Sep. 22, 2006 from Korean Patent Office in Appl. No. 10-2005-7016055.

Office Action from Singapore Patent Office in Appl. No. 200505388-9, dated Mar. 20, 2006.

Response to Office Action from Singapore Patent Office in Appl. No. 200505388-9, dated Aug. 11, 2006.

International Search Report issued on Oct. 25, 2004 in PCT/US2004/005531.

Written Opinion issued on Oct. 25, 2004 in PCT/US2004/005531.

Office Action issued on Mar. 24, 2005 in U.S. Appl. No. 10/851,542.

Response to Office Action dated Jul. 25, 2005 in U.S. Appl. No. 10/851,542.

Response to Office Action filed Jan. 19, 2006 in U.S. Appl. No. 10/851,542.

Office Action mailed Apr. 19, 2006 in U.S. Appl. No. 10/851,542.

Response to Office Action filed Jul. 26, 2006 in U.S. Appl. No. 10/851,542.

Final Office Action dated Oct. 26, 2006, in U.S. Appl. No. 10/851,542.

PCT International Search Report and Written Opinion for Application No. PCT/US2004/014524 dated Mar. 2, 2005.

PCT International Preliminary Report on Patentability for Application No. PCT/US2004/014524, dated Dec. 8, 2005.

PCT International Search Report for Application No. PCT/US2004/014523 dated Jan. 17, 2005.

PCT Written Opinion for Application No. PCT/US2004/014523 dated Jan. 17, 2005.

PCT International Preliminary Report on Patentability for Application No. PCT/US2004/014523, dated Dec. 8, 2005.

Voluntary Amendment filed Aug. 15, 2006 in TW Appl. No. 94143175.

PCT International Search Report and Written Opinion for Application No. PCT/US05/44781 dated Oct. 3, 2006.

Specification as filed Sep. 2, 2005, for U.S. Appl. No. 11/218,652.

Affinito, J.D. et al., "PML/oxide/PML Barrier Layer Performance Differences Arising from Use of UV or Electron Beam Polymerization of the PML Layers," *Thin Solid Films* 308-309:19-25 (1997).

Affinito, J.D. et al., "Polymer-Oxide Transparent Barrier Layers," Society of Vacuum Coaters, 39th Ann. Technical Conference Proceedings, May 5-10, 1996, Philadelphia, PA, pp. 392-397 (1996).

Alder, T. et al., "High-Efficiency Fiber-to-Chip Coupling Using Low-Loss Tapered Single-Mode Fiber," *IEEE Photonics Tech. Lett.* 12(8):1016-1018 (2000).

Almeida, V.R. et al., "Nanotaper for compact mode conversion," *Optics Letters* 28(15):1302-1304 (2003).

Asghari, M. and Dawnay, E., "ASOC™—A Manufacturing Integrated Optics Technology," *SPIE* 3620:252-262 (Jan. 1999).

Barbier, D. et al, "Amplifying Four-Wavelength Combiner, Based on Erbium/Ytterbium-Doped Waveguide Amplifiers and Integrated Splitters," *IEEE Photonics Tech. Lett.*.9:315-317 (1997).

Barbier, D., "Performances and potential applications of erbium doped planar waveguide amplifiers and lasers," *Proc. OAA*, Victoria, BC, Canada, pp. 58-63 (Jul. 21-23, 1997).

Beach R.J., "Theory and optimization of lens ducts," *Applied Optics* 35(12):2005-2015 (1996).

Belkind, A. et al., "Using pulsed direct current power for reactive sputtering of $Al_2O_3$," *J. Vac. Sci. Technol. A* 17(4):1934-1940 (1999).

Bestwick, T., "ASOC™ silicon integrated optics technology," *SPIE* 3631:182-190 (1999).

Borsella, E. et al., "Structural incorporation of silver in soda-lime glass by the ion-exchange process: A photoluminescence spectroscopy study," *Applied Physics A* 71:125-132 (2000).

Byer, R.L., "Nonlinear Optics and Solid-state Lasers: 2000," *IEEE J. Selected Topics in Quantum Electronics* 6(6):911-930 (2000).

Campbell, S.A. et al., "Titanium dioxide ($TiO_2$)-based gate insulators," *IBM J. Res. Develop.* 43(3):383-392 (1999).

Chang, C.Y. and Sze, S.M. (Eds.), in: *ULSI Technology*, The McGraw-Hill Companies, Inc., New York, Chapter 4, pp. 169-170, and 226-231 (1996).

Chen, G. et al. "Development of Supported Bifunctional Electrocatalysts for Unitized Regenerative Fuel Cells," *J. Electrochemical Society* 149(8):A1092-A1099 (2002).

Choi, Y.B. et al., "Er-Al-codoped silicate planar light waveguide-type amplifier fabricated by radio-frequency sputtering," *Optics Letters* 25(4):263-265 (2000).

Cooksey, K. et al. "Predicting Permeability & Transmission Rate for Multilayer Materials," *Food Technology* 53(9):60-63 (1999).

Crowder, M.A. et al., "Low-Temperature Single-Crystal Si TFT's Fabricated on Si Films Processed via Sequential Lateral Solidification," *IEEE Electron Device Lett.* 19(8):306-308 (1998).

Delavaux, J-M. et al., "Integrated optics erbium ytterbium amplifier system in 10Gb/s fiber transmission experiment," 22nd European Conference on Optical Communication, Oslo, I.123-I.126 (1996).

Distributed Energy Resources: Fuel Cells, Projects, 4 pages http://www.eere.energy.gov/der/fuel_cells/projects.html (2003).

Dorey, R.A., "Low temperature micromoulding of functional ceramic devices," Grant summary for GR/S84156/01 for the UK Engineering and Physical Sciences Research Council, 2 pages (2004).

DuPont Teijin Films, Mylar 200 SBL 300, Product Information, 4 pages (2000).

Electrometals Technologies Limited, Financial Report for 2002, Corporate Directory, Chairman's Review, Review of Operations, 10 pages (2002).

E-Tek website: FAQ, Inside E-Tek, E-Tek News, Products; http://www.etek-inc.com/, 10 pages (2003).

Flytzanis, C. et al, "Nonlinear Optics in Composite Materials," in: *Progress in Optics XXIX*, Elsevier Science Publishers B.V., pp. 323-425 (1991).

Frazao, O. et al., "EDFA Gain Flattening Using Long-Period Fibre Gratings Based on the Electric Arc Technique,"*Proc. London Comm. Symp. 2001*, London, England, 3 pages (2001).

Fujii, M. et al., "1.54 μm photoluminescence of $Er^{3+}$doped into $SiO_2$ films containing Si nanocrystals: Evidence for energy transfer from Si nanocrystals for $Er^{3+}$," *Appl. Phys. Lett.* 71(9):1198-1200 (1997).

Garcia, C. et al. "Size Dependence of Lifetime and Absorption Cross Section of Si Nanocrystals Embedded in $SiO_2$," *Appl. Phys. Lett.* 82(10):1595-1597 (2003).

Goossens, A. et al., "Sensitization of $TiO_2$ with p-type semiconductor polymers," *Chem. Phys. Lett.* 287:148 (1998).

Greene, J.E. et al., "Morphological and electrical properties of rf sputtered $Y_2O_3$-doped $ZrO_2$ thin films," *J. Vac. Sci. Tech.* 13(1):72-75 (1976).

Han, H.-S. et al. "Optical Gain at 1.54 μm in Erbium-Doped Silicon Nanocluster Sensitized Waveguide," *Appl. Phys. Lett.* 79(27):4568-4570 (2001).

Hayakawa, T. et al., "Enhanced fluorescence from $Eu^{3+}$ owing to surface plasma oscillation of silver particles in glass," *J. Non-Crystalline Solids* 259:16-22 (1999).

Hayakawa, T. et al, "Field enhancement effect of small Ag particles on the fluorescence from $Eu^{3+}$-doped $SiO_2$ glass," *Appl. Phys. Lett.* 74(11):1513-1515 (1999).

Hayfield, P.C.S., in: *Development of a New Material-Monolithic $Ti_4O_7$ Ebonix® Ceramic*, Royal Society of Chemistry, Cambridge, Table of Contents, 4 pages (2002).

Hehlen, M.P. et al. "Spectroscopic Properties of $Er^{3+}$- and $Yb^{3+}$-doped Soda-Lime Silicate and Aluminosilicate Glasses," *Physical Review B* 56(15):9302-9318 (1997).

Hehlen, M.P. et al. "Uniform Upconversion in High-Concentration $Er^{3+}$-doped Soda Lime Silicate and Aluminosilicate Glasses," *Optics Letters* 22(11):772-774 (1997).

Horst, F. et al., "Compact, Tunable Optical Devices in Silicon-Oxynitride Waveguide Technology," *Top. Meeting Integrated Photonics Res. '00*, Quebec, Canada, p. IThFl, 3 pages (2000).

Howson, R.P., "The reactive sputtering of oxides and nitrides," *Pure & Appl. Chem.* 66(6):1311-1318 (1994).

Hubner, J. and Guldberg-Kjaer, S., "Planar Er-and Yb-Doped Amplifiers and Lasers," COM Technical University of Denmark, 10th European Conf. On Integrated Optics, Session WeB2, pp. 71-74 (2001).

Hwang, M-S. et al., "The effect of pulsed magnetron sputtering on the properties of indium tin oxide thin films," *Surface and Coatings Tech.* 171:29-33 (2003).

Im, J.S. et al. "Controlled Super-Lateral Growth of Si Films for Microstructural Manipulation and Optimization," *Physica Status Solidi (A)* 166(2):603-617 (1998).

Im, J.S. and Sposili, R.S., "Crystalline Si Films for Integrated Active-Matrix Liquid Crystal Displays," *MRS Bulletin*, pp. 39-48 (1996).

Im, J.S. et al., "Single-crystal Si films for thin-film transistor devices," *Appl. Physics Lett.* 70(25):3434-3436 (1997).

Itoh, M. et al., "Large reduction of singlemode-fibre coupling loss in 1.5% Δ planar lightwave circuits using spot-size converters," *Electronics Letters* 38(2):72-74 (2002).

Jackson, M.K. and Movassaghi, M., "An Accurate Compact EDFA Model," Eur. Conf. Optical Comm., Munich, Germany, 2 pages (2000).

Janssen, R. et al. "Photoinduced electron transfer from conjugated polymers onto nanocrystalline $TiO_2$," Synthet. Metal., 1 page (1999).

Johnson, J.E. et al., "Monolithically Integrated Semiconductor Optical Amplifier and Electroabsorption Modulator with Dual-Waveguide Spot-Size Converter Input," *IEEE J. Selected Topics in Quantum Electronics* 6(1):19-25 (2000).

Jonsson L.B. et al. "Frequency response in pulsed DC reactive sputtering processes," *Thin Solid Films* 365:43-48 (2000).

Kato, K. and Inoue, Y., "Recent progress on PLC hybrid integration," *SPIE.* 3631:28-36 (1999).

Kato, K. and Tohmori, Y., "PLC Hybrid Integration Technology and Its Application to Photonic Components," *IEEE J. Selected Topics in Quantum Electronics* 6(1):4-13 (2000).

Kelly, P.J. et al., "Reactive pulsed magnetron sputtering process for alumina films," *J. Vac. Sci. Technol. A* 18(6):2890-2896 (2000).

Kelly, P.J. and Arnell, R.D., "Control of the structure and properties of aluminum oxide coatings deposited by pulsed magnetron sputtering," *J. Vac. Sci. Technol. A* 17(3):945-953 (1999).

Kik, P.G. and Polman, A., "Gain Limiting Processes in Er-doped Si Nanocrystal Waveguides in $SiO_2$," *J. Appl. Phys.* 91(1):534-536 (2002).

Kim, J-Y. et al. "Frequency-dependent pulsed direct current magnetron sputtering of titanium oxide films," *J. Vac. Sci. Technol. A* 19(2):429-434 (2001).

Kim, D-W. et al. "Mixture Behavior and Microwave Dielectric Properties in the Low-fired $TiO_2$-CuO System," *Jpn. J. Appl. Phys.* 39:2696-2700 (2000).

Ladouceur, F. and Love, J.D., in: *Silica-based Buried Channel Waveguides and Devices*, Chapman & Hall, London, Table of Contents, 6 pages (1996).

Ladouceur, F. et al., "Effect of side wall roughness in buried channel waveguides," *IEEE Proc. Optoelectron.* 141(4):242-248 (1994).

Lamb, W.B., "Designing Nonfoil Containing Skins for VIP Applications," DuPont VIA Symposium Presentation, 35 pages (1999).

Lamb, W. and Zeiler, R., "Designing Non-Foil Containing Skins for Vacuum Insulation Panel (VIP) Applications," *Vuoto XXVIII*(1-2):55-58 (1999).

Lange, M.R. et al, "High Gain Ultra-Short Length Phosphate glass Erbium-Doped Fiber Amplifier Material," OSA Optical Fiber Communications (OFC), 3 pages (2002).

Laporta, P. et al, "Diode-pumped cw bulk Er:Yb:glass laser," *Optics Letters* 16(24):1952-1954 (1991).

Laurent-Lund, C. et al., "PECVD Grown Multiple Core Planar Waveguides with Extremely Low Interface Reflections and Losses," *IEEE Photonics Tech. Lett.* 10(10):1431-1433 (1998).

Lee, K.K. et al., "Effect of size and roughness on light transmission in a $Si/SiO_2$ waveguide: Experiments and model," *Appl. Phys. Lett.* 77(11):1617-1619 (2000).

Lee, B.H. et al., "Effects of interfacial layer growth on the electrical characteristics of thin titanium oxide films on silicon," *Appl. Phys. Lett.* 74(21):3143-3145 (1999).

Love, J.D. et al., "Quantifying Loss Minimisation in Single-Mode Fibre Tapers," *Electronics Letters* 22(17):912-914 (1986).

Mardare, D. and Rusu, G.I., "On the structure of Titanium Oxide Thin Films," *Analele Stiintifice Ale Universitatii IASI*, Romania, pp. 201-208 (1999).

Marques, P.V.S. et al., "Planar Silica-on-Silicon Waveguide Lasers Based in Two Layer Core Devices," 10th European Conference on Integrated Optics, Session WeB2, pp. 79-82 (2001).

Meijerink, A. et al, "Luminescence of $Ag^+$ in Crystalline and Glassy $SrB_4O_7$," *J. Physics Chem. Solids* 54(8):901-906 (1993).

Mesnaoui, M. et al, "Spectroscopic properties of $Ag^+$ ions in phosphate glasses of $NaPO_3$- $AgPO_3$ system," *Eur. J Solid State Inorg. Chem.* 29:1001-1013 (1992).

Mitomi, O. et al., "Design of a Single-Mode Tapered Waveguide for Low-Loss Chip-to-Fiber Coupling," *IEEE J. Quantum Electronics* 30(8):1787-1793 (1994).

Mizuno, Y. et al. "Temperature dependence of oxide decomposition on titanium surfaces in UHV," *J. Vac. Sci. & Tech. A* 20(5):1716-1721 (2002).

Ohkubo, H. et al., "Polarization-Insensitive Arrayed-Waveguide Grating Using Pure $SiO_2$ Cladding," Fifth Optoelectronics and Communication Conference (OECC 2000) Technical Digest, pp. 366-367 (2000).

Ohmi, S. et al., "Rare earth metal oxides for high-K gate insulator," VLSI Design 2004, 1 page (2004).

Ohtsuki, T. et al., "Gain Characteristics of a high concentration $Er^{3+}$-doped phosphate glass waveguide," *J. Appl. Phys.* 78(6):3617-3621 (1995).

Ono, H. et al., "Design of a Low-loss Y-branch Optical Waveguide," Fifth Optoelectronic and Communications Conference (OECC 2000) Technical Digest, pp. 502-503 (2000).

Padmini, P. et al. "Realization of High Tunability Barium Strontium Titanate Thin Films by rf Magnetron Sputtering," *Appl. Phys. Lett.* 75(20):3186-3188 (1999).

Pan, T. et al., "Planar $Er^{3+}$-doped aluminosilicate waveguide amplifier with more than 10 dB gain across C-band," Optical Society of America, 3 pages (2000).

Peters, D.P. et al., "Formation mechanism of silver nanocrystals made by ion irradiation of $Na^+\leftrightarrow Ag^+$ ion-exchanged sodalime silicate glass," *Nuclear Instruments and Methods in Physics Research B* 168:237-244 (2000).

Rajarajan, M. et al., "Numerical Study of Spot-Size Expanders for an Efficient OEIC to SMF Coupling," *IEEE Photonics Technology Letters* 10(8):1082-1084 (1998).

Ramaswamy, R.V. et al., "Ion-Exchanged Glass Waveguides: A Review," *J. Lightwave Technology* 6(6):984-1002 (1988).

Roberts, S.W. et al., "The Photoluminescence of Erbium-doped Silicon Monoxide," University of Southampton, Department of Electronics and Computer Science Research Journal, 7 pages (1996).

Sanyo Vacuum Industries Co., Ltd. Products Info, $TiO_2$, (2003), 1 page http://www.sanyovac.co.jp/Englishweb/products/ETiO2.htm.

Schermer, R. et al., "Investigation of Mesa Dielectric Waveguides," Proceedings of the OSA Integrated Photonics Research Topical Meeting and Exhibit, Paper No. IWB3, 3 pages (2001).

Schiller, S. et al. "PVD Coating of Plastic Webs and Sheets with High Rates on Large Areas," European Materials Research Society 1999 Spring Meeting, Jun. 1-4, 1999, Strasbourg, France, 13 pages (1999).

Second International Symposium of Polymer Surface Modification: Relevance to Adhesion, Preliminary Program, 13 pages (1999).

Seventh International Conference on $TiO_2$ Photocatalysis: Fundamentals & Applications, Toronto, Ontario, Canada, Final Program, 7 pages (Nov. 17-21, 2002).

Sewell, P. et al., "Rib Waveguide Spot-Size Transformers: Modal Properties," *J. Lightwave Technology* 17(5):848-856 (1999).

Shaw, D.G. et al., "Use of Vapor Deposited Acrylate Coatings to Improve the Barrier Properties of Metallized Film," Society of Vacuum Coaters, 37th Annual Technical Conference Proceedings, pp. 240-244 (1994).

Shin, J.C. et al. "Dielectric and Electrical Properties of Sputter Grown $(Ba,Sr)TiO_3$ Thin Films," *J. Appl. Phys.* 86(1):506-513 (1999).

Shmulovich, J. et al., "Recent progress in Erbium-doped waveguide amplifiers," Bell Laboratories, pp. 35-37 (1999).

Slooff, L.H. et al, "Optical properties of Erbium-doped organic polydentate cage complexes," *J. Appl. Phys.* 83(1):497-503 (1998).

Smith, R.E. et al., "Reduced Coupling Loss Using a Tapered-Rib Adiabatic-Following Fiber Coupler," *IEEE Photonics Technology Lett.* 8(8):1052-1054 (1996).

Strohhofer, C. and Polman, A. "Energy transfer to $Er^{3+}$ in Ag ion-exchanged glass," FOM Institute for Atomic and Molecular Physics, 10 pages (2001).

Sugiyama, A. et al., "Gas Permeation Through the Pinholes of Plastic Film Laminated with Aluminium Foil," *Vuoto* XXVIII(1-2):51-54 (1999).

Tervonen, A., "Challenges and opportunities for integrated optics in optical networks," *SPIE* 3620:2-11 (1999).

Ting, C.Y. et al., "Study of planarized sputter-deposited $SiO_2$," *J. Vac. Sci. Technol,* 15(3):1105-1112 (1978).

Treichel, O. and Kirchhoff, V., "The influence of pulsed magnetron sputtering on topography and crystallinity of $TiO_2$ films on glass," *Surface and Coatings Technology* 123:268-272 (2000).

Tukamoto, H. and West, A.R., "Electronic Conductivity of $LiCoO_s$ and Its Enhancement by Magnesium Doping," *J. Electrochem. Soc.* 144(9):3164-3168 (1997).

Van Dover, R.B., "Amorphous Lanthanide-Doped $TiO_x$ Dielectric Films," *Appl. Phys. Lett.* 74(20):3041-3043 (1999).

Viljanen, J. and Leppihalme, M., "Planar Optical Coupling Elements for Multimode Fibers with Two-Step Ion Migration Process," *Applied Physics* 24(1):61-63 (1981).

Villegas, M.A. et al., "Optical spectroscopy of a soda lime glass exchanged with silver," *Phys. Chem. Glasses* 37(6):248-253 (1996).

Von Rottkay, K. et al., "Influence of stoichiometry on electrochromic cerium-titanium oxide compounds," Presented at the 11th Int'l. Conference of Solid State Ionics, Honolulu, Hawaii, Nov. 19, 1997, Published in *Solid State Ionics* 113-115:425-430. (1998).

Westlinder, J. et al., "Simulation and Dielectric Characterization of Reactive dc Magnetron Cosputtered $(Ta_2O_5)_{1-x}(TiO_2)_x$ Thin Films," *J. Vac. Sci. Technol. B* 20(3):855-861 (May/Jun. 2002).

Wilkes, K.E., "Gas Permeation Through Vacuum Barrier Films and its Effect on VIP Thermal Performance," presented at the Vacuum Insulation Panel Symp., Baltimore, Maryland, 21 pages (May 3, 1999).

Yanagawa, H. et al., "Index-and-Dimensional Taper and Its Application to Photonic Devices," *J. Lightwave Technology* 10(5):587-591 (1992).

Yoshikawa, K. et al., "Spray formed aluminum alloys for sputtering targets," *Powder Metallurgy* 43(3):198-199 (2000).

Zhang, H. et al. "High Dielectric Strength, High k $TiO_2$ Films by Pulsed DC, Reactive Sputter Deposition," 5 pages (2001).

Office Action issued on Sep. 27, 2004 in U.S. Appl. No. 10/291,179.
Response to Office Action filed on Mar. 14, 2005 in U.S. Appl. No. 10/291,179.
Office Action issued on Jun. 15, 2005 in U.S. Appl. No. 10/291,179.
Office Action issued on May 2, 2002 in U.S. Patent No. 6,533,907.
Response to Office Action filed on Sep. 3, 2002 in U.S. Patent No. 6,533,907.
Office Action issued on Feb. 12, 2004 in U.S. Appl. No. 09/903,081.
Response to Office Action filed on Aug. 10, 2004 in U.S. Appl. No. 09/903,081.
Office Action issued on Sep. 10, 2004 in U.S. Appl. No. 09/903,081.
Amendment/RCE filed on Mar. 10, 2005 in U.S. Appl. No. 09/903,081.
Office Action issued on Mar. 17, 2005 in U.S. Appl. No. 09/903,081.
Response to Office Action filed on Jun. 17, 2005 in U.S. Appl. No. 09/903,081.
Office Action issued on Jul. 8, 2005 in U.S. Appl. No. 09/903,081.
Office Action issued on May 14, 2003 in U.S. Appl. No. 10/101,492.
Response to Office Action filed on Aug. 14, 2003 in U.S. Appl. No. 10/101,492.
Office Action issued on Sep. 3, 2003 in U.S. Appl. No. 10/101,492.
Response to Office Action filed on Mar. 3, 2004 in U.S. Appl. No. 10/101,492.
Office Action issued Sep. 21, 2005 in U.S. Appl. No. 11/100,856.
Office Action issued on Feb. 24, 2004 in U.S. Appl. No. 10/101,863.
Response to Office Action filed on Jul. 23, 2004 in U.S. Appl. No. 10/101,863.
Office Action issued on Oct. 6, 2004 in U.S. Appl. No. 10/101,863.
Office Action dated Jan. 13, 2005, received in U.S. Appl. No. 10/101,863.
Response to office Action filed on Jun. 10, 2005 in U.S. Appl. No. 10/101,863.
Office Action issued on Aug. 4, 2005, in U.S. Appl. No. 10/101,863.
Office Action dated Mar. 25, 2005, received in U.S. Appl. No. 10/954,182.
Office Action issued on Oct. 25, 2005, in U.S. Appl. No. 10/954,182.
Office Action issued on Oct. 22, 2003 in U.S. Appl. No. 10/101,341.

Response to Office Action filed on Feb. 23, 2004 in U.S. Appl. No. 10/101,341.
Office Action issued on Jun. 10, 2004 in U.S. Appl. No. 10/101,341.
Response to Office Action filed on Dec. 8, 2004 in U.S. Appl. No. 10/101,341.
Office Action issued on Aug. 8, 2005 in U.S. Appl. No. 10/101,341.
Office Action issued on May 4, 2004 in U.S. Appl. No. 10/101,493.
Office Action issued on Oct. 3, 2005 in U.S. Appl. No. 10/650,461.
Office Action issued on Oct. 19, 2005 in U.S. Appl. No. 10/851,542.
Office Action dated May 21, 2007, in U.S. Appl. No. 10/291,179.
Final Office Action dated May 2, 2007, in U.S. Appl. No. 10/101,863.
Response to Final Office Action filed Oct. 2, 2007, in U.S. Appl. No. 10/101,863.
Response to Office Action filed Mar. 30, 2007, in U.S. Appl. No. 10/954,182.
Notice of Non-Compliant Amendment dated Apr. 12, 2007, in U.S. Appl. No. 10/954,182.
Response to Notice of Non-Compliant Amendment filed Apr. 23, 2007, in U.S. Appl. No. 10/954,182.
Final Office Action dated Jul. 24, 2007, in U.S. Appl. No. 10/954,182.
Preliminary Amendment dated Sep. 16, 2005, in U.S. Appl. No. 11/228,834.
Preliminary Amendment dated Jul. 27, 2005, in U.S. Appl. No. 11/191,643.
Corrected Preliminary Amendment dated Sep. 19, 2005, in U.S. Appl. No. 11/191,643.
Notice of Allowance dated Mar. 26, 2007, in U.S. Appl. No. 11/228,805.
Corrected Notice of Allowance dated Jun. 7, 2007, in U.S. Appl. No. 11/228,805.
Supplemental Notice of Allowance dated Jul. 5, 2007, in U.S. Appl. No. 11/228,805.
Voluntary Amendment dated Mar. 8, 2007, in Taiwan Application No. 93114518.
Second Supplemental Preliminary Amendment filed May 31, 2007, in U.S. Appl. No. 11/297,057.
International Preliminary Report on Patentability dated Jun. 21, 2007, in International Application No. PCT/US05/044781.
First Office Action dated Jul. 25, 2008 from the State Intellectual Property Office of Peoples Republic of China in Appl. No. 200480005515.5.
First Office Action dated Jun. 27, 2008 from the State Intellectual Property Office of People's Republic of China in Appl. No. 200480020874.8.
Lee, W.J. et al. "Optimizing indium tin oxide thin films with bipolar d.c.-pulsed magnetron sputtering for electrochromic device applications", *J. Mater. Sci: Mat in Elec*. vol. 13:751-756 (2002).
Mientus, R. et al., "Reactive magnetron sputtering of tin-doped indium oxide (ITO): influence of argon pressure and plasma excitation mode", *Surface and Coatings Tech*. vol. 142-144:748-754 (2001).
First Office Action dated Jul. 18, 2008 from the State Intellectual Property Office of People's Republic of China in Appl. No. 200580042305.8.
Response to Office Action dated Nov. 21, 2007, in U.S. Appl. No. 10/291,179.
Notice of Allowance dated Mar. 4, 2008, in U.S. Appl. No. 10/291,179.
Office Action dated Nov. 15, 2007, in U.S. Appl. No. 10/101,863.
Response to Office Action dated Dec. 18, 2007, in U.S. Appl. No. 10/101,863.
Notice of Allowance dated Jan. 25, 2008, in U.S. Appl. No. 10/101,863.
Amendment/RCE filed Oct. 24, 2007, in U.S. Appl. No. 10/954,182.
Office Action dated Nov. 15, 2007, in U.S. Appl. No. 10/954,182.
Response to Office Action dated Dec. 18, 2007, in U.S. Appl. No. 10/954,182.
Notice of Allowance dated Feb. 1, 2008, in U.S. Appl. No. 10/954,182.
Preliminary Amendment dated Mar. 11, 2008, in U.S. Appl. 11/228,717.
Notice of Allowance dated Apr. 2, 2008, in U.S. Appl. No. 11/228,717.
Office Action dated Feb. 15, 2008, in U.S. Appl. No. 10/850,968.
PCT International Search Report and Written Opinion for Application No. PCT/US06/33315 mailed Feb. 28, 2008.
Office Action dated May 29, 2008, in U.S. Appl. No. 11/228,834.
Response to Office Action filed Jun. 16, 2008, in U.S. Appl. No. 10/850,968.
Supplemental Amendment filed Jun. 27, 2008, in U.S. Appl. No. 10/850,968.
EPO Extended Search Report dated Feb. 26, 2008, for EP Application No. 05853649.1.
Response to Office Action filed Sep. 29, 2008, in U.S. Appl. No. 11/228,834.
Notice of Allowance dated Dec. 30, 2008, in U.S. Appl. No. 11/228,834.
Office Action dated Mar. 30, 2009, in U.S. Appl. No. 11/191,643.
Response to First Office Action filed Feb. 9, 2009, with the State Intellectual Property Office of People's Republic of China in Appl. No. 200480005515.5.
First Office Action dated Dec. 5, 2008, from the State Intellectual Property Office of People's Republic of China in Appl. No. 200480021078.6.
Final Office Action dated Oct. 15, 2008, in U.S. Appl. No. 10/850,968.
Supplemental Final Office Action dated Dec. 5, 2008, in U.S. Appl. No. 10/850,968.
Amendment After Final filed Apr. 15, 2009, in U.S. Appl. No. 10/850,968.
Response to First Office Action filed Jan. 12, 2009, with the State Intellectual Property Office of People's Republic of China in Appl. No. 200480020874.8.
Response to First Office Action filed Feb. 2, 2009, with the State Intellectual Property Office of People's Republic of China in Appl. No. 200580042305.8.
Examination Report dated Jul. 24, 2008, for EP Application No. 05853649.1.
Response to Examination Report filed Feb. 3, 2009, for EP Application No. 05853649.1.
Office Action dated Nov. 5, 2008 from the Intellectual Property Office (IPO) in Appl. No. 94143175.
PCT International Preliminary Report on Patentability for Application No. PCT/US06/33315 mailed Mar. 19, 2009.
Supplemental Notice of Allowance dated Apr. 23, 2009, in U.S. Appl. No. 11/228,834.
Supplemental Notice of Allowance dated Jul. 17, 2008, in U.S. Appl. No. 11/228,717.
Amendment and Response to Office Action filed Sep. 30, 2009, in U.S. Appl. No. 11/191,643.
Notice of Non-Compliant Amendment mailed Nov. 9, 2009, in U.S. Appl. No. 11/191,643.
Response to Notice of Non-Compliant Amendment filed Dec. 9, 2009, in U.S. Appl. No. 11/191,643.
Notice of Non-Compliant Amendment mailed Jan. 25, 2010, in U.S. Appl. No. 11/191,643.
Response to Notice of Non-Compliant Amendment filed Feb. 24, 2010, in U.S. Appl. No. 11/191,643.
Final Office Action dated Apr. 27, 2010, in U.S. Appl. No. 11/191,643.
Decision for Allowance for Registration dated Feb. 1, 2007, in Application No. 10-2005-7016055, Translation.
Certificate of Grant of Patent dated Sep. 28, 2007, in Application No. 200505388-9.
International Preliminary Report on Patentability dated Sep. 15, 2005, in PCT/US2004/005531.
Office Action mailed Mar. 2, 2010, in U.S. Appl. No. 11/726,972.
Response to first Office Action filed Jun. 18, 2009, with the State Intellectual Property Office of P.R.C., in Appl. No. CN200480021078.6, Translation.
Second Office Action dated Aug. 14, 2009, from the State Intellectual Property Office of P.R.C., in Appl. No. CN200480021078.6, Translation.
Response to second Office Action filed Dec. 29, 2009, with the State Intellectual Property Office of People's Republic of China in Appl. No. 200480021078.6, Translation.

Rejection Decision mailed Feb. 5, 2010, from the State Intellectual Property Office of P.R.C., in Appl. No. 200480021078.6.

Office Action mailed Apr. 30, 2009, in U.S. Appl. No. 10/850,968.

Amendment in Response to Office Action filed Oct. 28, 2009, in U.S. Appl. No. 10/850,968.

Final Office Action mailed Feb. 26, 2010, in U.S. Appl. No. 10/850,968.

Final Office Action mailed Apr. 21, 2010, in U.S. Appl. No. 10/850,968.

Second Office Action dated Aug. 14, 2009, from the State Intellectual Property Office of P.R.C. in Appl. No. 200480020874.8, Translation.

Response to second Office Action filed Dec. 29, 2009, with the State Intellectual Property Office of People's Republic of China in Appl. No. 200480020874.8, Translation.

Office mailed Jan. 29, 2010, in U.S. Appl. No. 11/297,057.

Second Office Action dated May 8, 2009, from the State Intellectual Property Office of People's Republic of China in Appl. No. 200580042305.8, Translation.

Response to Second Office Action filed Sep. 22, 2009, with the State Intellectual Property Office of P.R.C., in Appl. No. 200580042305.8, Translation.

Third Office Action dated Jan. 29, 2010, from the State Intellectual Property Office of People's Republic of China in Appl. No. 200580042305.8, Translation.

Communication Under Rule 71(3) EPC -Intent to Grant dated May 27, 2009, in EP Appl. No. 05853649.1.

Office Action dated Apr. 22, 2010, in Korean Appl. No. 10-2007-7014536, Translation.

Response to Office Action filed May 5, 2009, with the Intellectual Property Office (IPO) in Appl. No. 94143175, Translation.

Written Primary Decision of Rejection dated Jan. 6, 2010, from the Intellectual Property Office (IPO) in Appl. No. 94143175, Translation.

Office Action mailed Jul. 9, 2009, in U.S. Appl. No. 11/218,652.

Amendment in Response to Office Action filed Dec. 8, 2009, in U.S. Appl. No. 11/218,652.

Notice of Allowance mailed Feb. 23, 2010, in U.S. Appl. No. 11/218,652.

Written Opinion mailed Apr. 3, 2009, from the Australian Patent Office in SG Appl. No. 200801749-3.

Response to Written Opinion filed Dec. 11, 2009, with the Intellectual Property Office of Singapore, in SG Appl. No. 200801749-3.

* cited by examiner

| PEROVSKITE | ~302 |
|---|---|
| SUBSTRATE | ~301 |

FIG. 3A

| SECOND ELECTRODE | ~304 |
|---|---|
| PEROVSKITE | ~302 |
| FIRST ELECTRODE | ~303 |
| SUBSTRATE | ~301 |

FIG. 3B

| TOP ELECTRODE | ~304 |
|---|---|
| PEROVSKITE | ~302 |
| · | |
| · | |
| · | ~304 |
| PEROVSKITE | ~302 |
| THIRD ELECTRODE | ~304 |
| PEROVSKITE | ~302 |
| SECOND ELECTRODE | ~304 |
| PEROVSKITE | ~302 |
| FIRST ELECTRODE | ~303 |
| SUBSTRATE | ~301 |

FIG. 6

DEPOSITION OF PEROVSKITE AND OTHER COMPOUND CERAMIC FILMS FOR DIELECTRIC APPLICATIONS

FIELD OF THE INVENTION

The present invention is related to production and application of dielectric thin-films and, in particular, the deposition of perovskites such as Barium Strontium Titanate (BST) films and other ceramic oxides for dielectric applications.

DISCUSSION OF RELATED ART

Perovskite films, for example Barium Strontium Titanate (BST) films, are one of the attractive materials to use in capacitors for high density device applications because of its relatively high dielectric constant, low leakage current density, high dielectric breakdown strength, and ferroelectric perovskite phase that does not exhibit fatigue. However, electric properties of the perovskite films are greatly dependent on the deposition process, the substrate, the post-processing, and the related film structure. For all of the potential, thin film perovskites have rarely been utilized in manufacture primarily because of difficulties in controlling physical and chemical properties of the crystalline and amorphous phases of perovskite thin-film materials and their interactions with metallic and conductive electrodes.

Solid-state thin-film devices are typically formed by stacking thin films of metal and dielectric on a substrate. The thin films typically include two metallic electrodes with a dielectric layer in between. The thin films can be deposited utilizing a number of deposition processes, including sputtering, electroplating, chemical vapor deposition, sol gel, or oxidation. Substrates suitable for these applications have conventionally been high temperature materials capable of withstanding at least one high temperature anneal process to at least 650-750° C. so as to crystallize the perovskite dielectric film in order to increase its dielectric constant. Such a substrate can be any suitable material with appropriate structural and material properties, for example a semiconductor wafer, refractory metallic sheet (e.g., titanium, zirconium, or stainless steel), ceramic such as alumina, or other material capable of withstanding subsequent high temperature processing.

However, conventional materials and production processes can limit the types of materials that can be used in device manufacture. Typically, the dielectric material is deposited in amorphous form and then the material is heated in an anneal process to form the crystalline material. Conventional formation of perovskite layers, for example, require an anneal at or above 650° C. to transform the deposited amorphous film to a crystalline form. Such a high temperature anneal, however, severely limits the materials that can be utilized as the substrate, and often requires the use of expensive noble metals such as platinum to protect the substrate from reaction with the electrode material. Such high heat-treat temperatures are incompatible with standard semiconductor or MEM device processing, and limit the choice of substrate materials on which the layers can be formed, increasing the cost, and decreasing the yield of such devices formed with the layers.

Therefore, there is a need for a low temperature process for depositing crystalline material, for example perovskite material and other ceramic oxides, onto a substrate.

SUMMARY

In accordance with the present invention, deposition of layers in a pulsed-DC physical vapor deposition process from a conductive ceramic target is presented. In some embodiments, the deposition can provide a low-temperature, high deposition-rate deposition of a dense amorphous layer of BST from a conductive BST target, which can be annealed at much lower temperature to yield crystalline BST. Some embodiments of the deposition address the need for low temperature, high rate deposition of perovskite films, for example BST films, which can be utilized as the dielectric layer in high specific capacitance devices as, for example, de-coupling capacitors, energy storage devices, voltage tunable capacitors, or other micro-electronic devices.

A method of depositing a perovskite or ceramic oxide layer according to some embodiments of the present invention includes placing a substrate in a reactor; flowing a gaseous mixture, for example argon and oxygen, through the reactor; and applying pulsed-DC power to a target formed of conductive perovskite or ceramic oxide material, such as BST, positioned opposite the substrate.

In some embodiments the perovskite layer can be formed utilizing radio frequency (RF) sputtering. The perovskite is deposited by RF sputtering of a wide area target in the presence of a sputtering gas under a condition of uniform target erosion. The substrate is positioned opposite a planar target formed of perovskite, for example BST, the area of the target being larger than the area of the substrate. A central area of the target of the same size as the substrate and overlying the substrate is exposed to a uniform plasma condition, which provides a condition of uniform target erosion. A uniform plasma condition can be created without magnetic enhancement, termed diode sputtering, or by providing a time-averaged uniform magnetic field by scanning a magnet across the target in a plane parallel to the plane of the target.

A film produced utilizing a pulsed dc, bias PVD process with a conductive ceramic target can be deposited at much higher rates than an insulating ceramic process, which requires an RF sputtering process. Further, deposition occurs with much less oxygen present in the gas flow to provide a fully oxidized film as opposed to a metallic target. The resulting film is much higher density than the low rate films. The films can be stoichiometric, uniform, highly dense, with low sintering temperatures and resulting high dielectric properties.

In some embodiments, the substrate is preheated. The substrate can be heated to a temperature of about 400° C. or below during deposition for low temperature perovskite deposition, or to higher temperatures for perovskite deposition on substrates capable of withstanding such temperature regime. Substrates suitable for low temperature perovskite deposition include glass, plastic, metal foil, stainless steel, and copper. A perovskite layer of thickness up to several microns thick can be deposited, although layers of any thickness can be formed.

In some embodiments the perovskite layer formed on the substrate is later annealed. The anneal temperature can be as low as 400° C. for low temperature anneal, and higher for perovskite deposition on substrates capable of withstanding such higher temperature regime. In some embodiments the perovskite target can be doped with transition metal dopants, for example manganese, transition elements, lanthanides (including the rare earth ions) and/or amphoteric elements.

In some embodiments, a stacked capacitor structure can be formed. The stacked capacitor structure includes one or more capacitor stacks deposited on a thin substrate, wherein each capacitor stack includes: a bottom electrode layer, a perovskite, for example BST, dielectric layer deposited over the bottom electrode layer; and a top electrode layer deposited over the dielectric layer. A top conducting layer can be deposited over the capacitor stacks.

In some embodiments, a capacitor structure can be formed in a cluster tool. An exemplary method of producing a capacitor in a cluster tool includes loading a substrate into the cluster tool; depositing an electrode layer over the substrate in a first chamber of the cluster tool; depositing a perovskite dielectric layer over the electrode layer in a second chamber of the cluster tool; depositing a second electrode layer over the dielectric layer in a third chamber. In some embodiments the first and the second electrode layers can be deposited in the same chamber.

A fixture for holding a thin substrate can include a top portion; and a bottom portion, wherein the thin substrate is held when the top portion is attached to the bottom portion.

In some embodiments, the ceramic layer can be deposited on a substrate coated with iridium or other refractory conductive material to provide a low temperature anneal processed capacitive structure.

These and other embodiments of the invention are further discussed below with reference to the following figures. It is to be understood that both the foregoing general description and the following detailed description are exemplary and explanatory only and are not restrictive of the invention, as claimed. Further, specific explanations or theories regarding the deposition or performance of materials according to the present invention are presented for explanation only and are not to be considered limiting with respect to the scope of the present disclosure or the claims.

BRIEF DESCRIPTION OF THE DRAWINGS

FIGS. 3A and 3B illustrate a thin-film capacitor design according to some embodiments of the present invention.

FIG. 6 illustrates an example of stacked capacitor structure with dielectric perovskite layers deposited according to some embodiments of the present invention.

In the figures, elements having the same designation have the same or similar functions.

DETAILED DESCRIPTION

In accordance with embodiments of the present invention, dielectric perovskite films or other ceramic oxide films are deposited on a substrate by a pulsed-DC physical vapor deposition (PVD) process utilizing a conductive ceramic target. In some embodiments, the film can be deposited by RF sputtering.

In some embodiments, a dielectric perovskite layer, for example BST material, is deposited directly on the substrate with only low temperature anneal, eliminating the need of a subsequent high temperature anneal to crystallize the film. Removing the high temperature anneal allows for formation of capacitor structures on light-weight, low temperature, and low cost substrates such as copper foil and plastic sheet, reducing both the weight and the cost of capacitors while maintaining the high dielectric constant of the perovskite, for example BST, high-density dielectric film.

Deposition of materials by pulsed-DC, RF biased reactive ion deposition is described in U.S. patent application Ser. No. 10/101,863, now U.S. Pat. No. 7,378,356, entitled "Biased Pulse DC Reactive Sputtering of Oxide Films,"to Hongmei Zhang, et al., filed on Mar. 16, 2002. Preparation of targets is described in U.S. patent application Ser. No. 10/101,341, entitled "Rare-Earth Pre-Alloyed PVD Targets for Dielectric Planar Applications," to Vassiliki Milonopoulou, et al., filed on Mar. 16, 2002 and now abandoned. U.S. patent application Ser. No. 10/101,863 and U.S. patent application Ser. No. 10/101,341 are each assigned to the same assignee as is the present disclosure and each is incorporated herein in their entirety. Deposition of oxide materials by RF sputtering has also been described in U.S. Pat. No. 6,506,289, which is also herein incorporated by reference in its entirety. Transparent oxide films can be deposited utilizing processes similar to those specifically described in U.S. Pat. No. 6,506,289 and U.S. application Ser. No. 10/101,863.

Figure 1A:
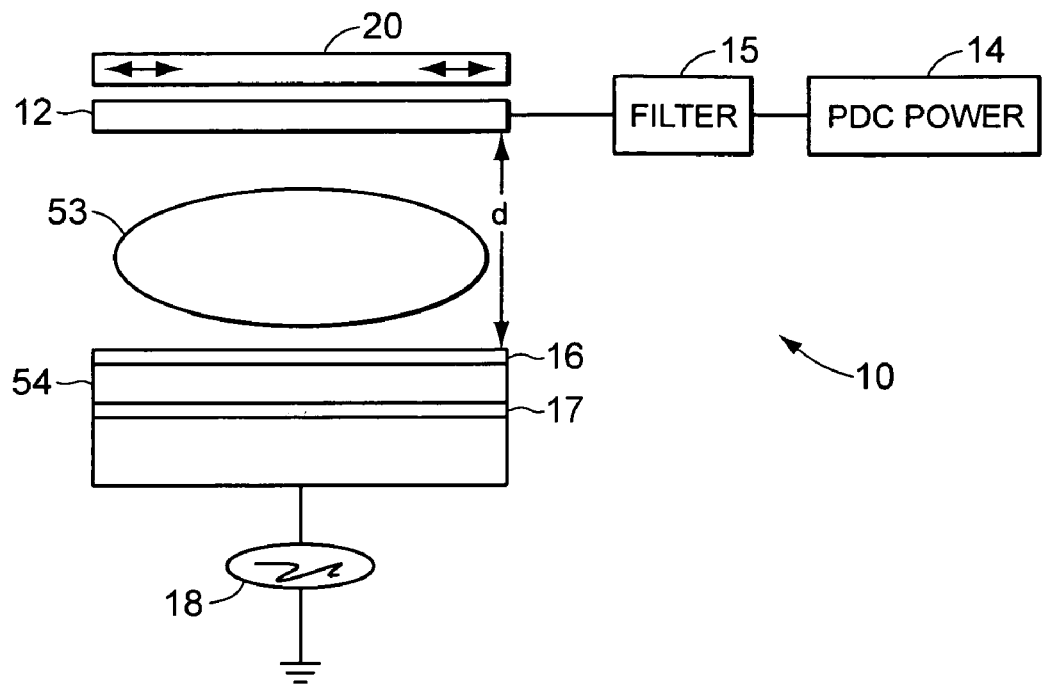
FIGS. 1A and 1B illustrate a pulsed-DC biased reactive deposition apparatus that can be utilized in the methods of depositing according to the present invention.

FIG. 1A shows a schematic of a reactor apparatus 10 for sputtering material from a target 12 according to the present invention. In some embodiments, apparatus 10 may, for example, be adapted from an AKT-1600 PVD (400×500 mm substrate size) system from Applied Komatsu or an AKT-4300 (600×720 mm substrate size) system from Applied Komatsu, Santa Clara, Calif. The AKT-1600 reactor, for example, has three deposition chambers connected by a vacuum transport chamber. These AKT reactors can be modified such that pulsed DC power is supplied to the target and RF power is supplied to the substrate during deposition of a material film.

Apparatus 10 includes target 12, which is electrically coupled through a filter 15 to a pulsed DC power supply 14. In some embodiments, target 12 is a wide area sputter source target, which provides material to be deposited on a substrate 16. Substrate 16 is positioned parallel to and opposite target 12. Target 12 functions as a cathode when power is applied to it from the pulsed DC power supply 14 and is equivalently termed a cathode. Application of power to target 12 creates a plasma 53. Substrate 16 is capacitively coupled to an electrode 17 through an insulator 54. Electrode 17 can be coupled to an RF power supply 18. A magnet 20 is scanned across the top of target 12.

For pulsed reactive DC magnetron sputtering, as performed by apparatus 10, the polarity of the power supplied to target 12 by power supply 14 oscillates between negative and positive potentials. During the positive period, the insulating layer on the surface of target 12 is discharged. To obtain arc free deposition, the pulsing frequency exceeds a critical frequency that can depend on target material, cathode current and reverse time. High quality films can be made using reactive pulse DC magnetron sputtering as shown in apparatus 10.

Pulsed DC power supply 14 can be any pulsed DC power supply, for example an AE Pinnacle plus 10K by Advanced Energy, Inc. With this DC power supply, up to 10 kW of pulsed DC power can be supplied at a frequency of between 0 and 350 kHz. The reverse voltage can be 10% of the negative target voltage. Utilization of other power supplies can lead to different power characteristics, frequency characteristics and reverse voltage percentages. The reverse time on this embodiment of power supply 14 can be adjusted between 0 and 5 µs.

Filter 15 prevents the RF bias power from power supply 18 from coupling into pulsed DC power supply 14. In some embodiments, power supply 18 can be a 2 MHz RF power supply, for example a Nova-25 power supply made by ENI, Colorado Springs, Colo.

In some embodiments, filter 15 can be a 2 MHz sinusoidal band rejection filter. In some embodiments, the band width of the filter can be approximately 100 kHz. Filter 15, therefore, prevents the 2 MHz power from the bias to substrate 16 from damaging power supply 14 while allowing the full bandwidth of the pulsed DC power supply to pass filter 15.

Pulsed DC deposited films are not fully dense and may have columnar structures. Columnar structures can be detrimental to thin film applications such as barrier films and dielectric films, where high density is important, due to the boundaries between the columns. The columns act to lower the dielectric strength of the material, but may provide diffusion paths for transport or diffusion of electrical current, ionic current, gas, or other chemical agents such as water.

In the AKT-1600 based system, for example, target 12 can have an active size of about 675.70×582.48 by 4 mm in order to deposit films on substrate 16 that have dimension about 400×500 mm. The temperature of substrate 16 can be adjusted to between −50° C. and 500° C. The distance between target 12 and substrate 16 can be between about 3 and about 9 cm. Process gas can be inserted into the chamber of apparatus 10 at a rate up to about 200 sccm while the pressure in the chamber of apparatus 10 can be held at between about 0.7 and 6 milliTorr. Magnet 20 provides a magnetic field of strength between about 400 and about 600 Gauss directed in the plane of target 12 and is moved across target 12 at a rate of less than about 20-30 sec/scan. In some embodiments utilizing the AKT 1600 reactor, magnet 20 can be a race-track shaped magnet with dimensions about 150 mm by 600 mm.

In some embodiments of the present invention a perovskite layer is deposited by RF sputtering with a wide area target and a condition of uniform target erosion. An example apparatus 30 for RF sputtering is illustrated schematically in FIG. 1C. Apparatus 30 includes an RF power supply 60 coupled to wide area sputter source target 12 which provides material to be deposited on substrate 16. Substrate 16 is positioned parallel to and opposite target 12. Target 12 functions as a cathode when RF power is applied to it and is equivalently termed the cathode. In the present disclosure, target 12 can be formed from a perovskite material, for example BST, for deposition of dielectric perovskite film. Substrate 16 is a solid, smooth surface. Substrate 16 typically is supported on a holder or carrier sheet 17 that may be larger than substrate 16.

In some embodiments, a feature of the RF sputtering method is that the area of wide area target 12 is greater than the area on the carrier sheet on which physically and chemically uniform deposition is accomplished. Secondly, a central region on target 12, overlying the substrate 16, can be provided with a very uniform condition of sputter erosion of the target material. Uniform target erosion is a consequence of a uniform plasma condition. In the following discussion, all mention of uniform condition of target erosion is taken to be equivalent to uniform plasma condition. Uniform target erosion is evidenced by the persistence of film uniformity throughout an extended target life. A uniform deposited film is defined as a film having a nonuniformity in thickness, when measured at representative points on the entire surface of a substrate wafer, of less than about 5%. Thickness nonuniformity is defined, by convention, as the difference between the minimum and maximum thickness divided by twice the average thickness. If films deposited from a target from which more than about 20% of the weight of the target has been removed under constant process conditions continue to exhibit thickness uniformity, then the sputtering process is judged to be in a condition of uniform target erosion for all films deposited during the target life.

Thus, a uniform plasma condition can be created in the region between the target and the substrate overlying the substrate. The region of uniform plasma condition is indicated in the exploded view of FIG. 1B. A plasma is created in the region denoted 51, which extends under the entire target 12. The central region of the target 52 experiences the condition of uniform sputter erosion. As discussed further below, a layer deposited on a substrate placed anywhere below central region 52 will have uniform film thickness.

In addition, the region in which deposition provides uniform film thickness is larger than the area in which deposition provides a film with uniform physical or optical properties such as chemical composition or index of refraction. In the present invention the target can be planar or approximately planar for the formation of a film on a planar substrate which is to be coated with the material of the target. In practice, planarity of the target means that all portions of the target surface in region 52 are within a few millimeters of an ideal planar surface, typically within 0.5 mm.

Figure 1B:
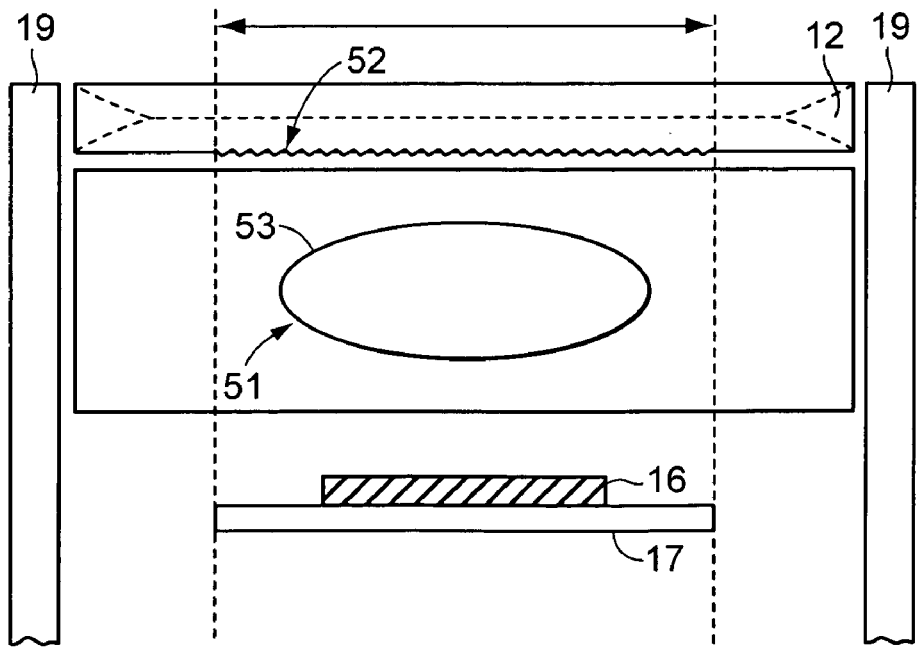
Figure 2:
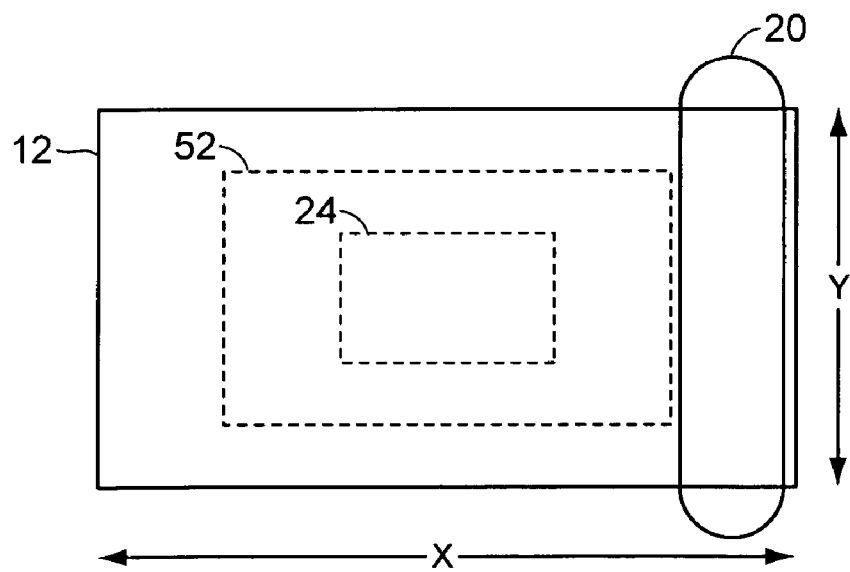
FIG. 2 shows an example of a target that can be utilized in the reactor illustrated in FIGS. 1A, 1B, and 1C.

FIG. 2 illustrates an example of target 12. A film deposited on a substrate positioned on carrier sheet 17 directly opposed to region 52 of target 12 has good thickness uniformity. Region 52 is the region shown in FIG. 1B that is exposed to a uniform plasma condition. In some implementations, carrier 17 can be coextensive with region 52. Region 24 shown in FIG. 2 indicates the area below which both physically and chemically uniform deposition can be achieved, for example where physical and chemical uniformity provide refractive index uniformity. FIG. 2 indicates region 52 of target 12 that provides thickness uniformity, which is, in general, larger than region 24 of target 12 providing thickness and chemical uniformity to the deposited film. In optimized processes, however, regions 52 and 24 may be coextensive.

Figure 1C:
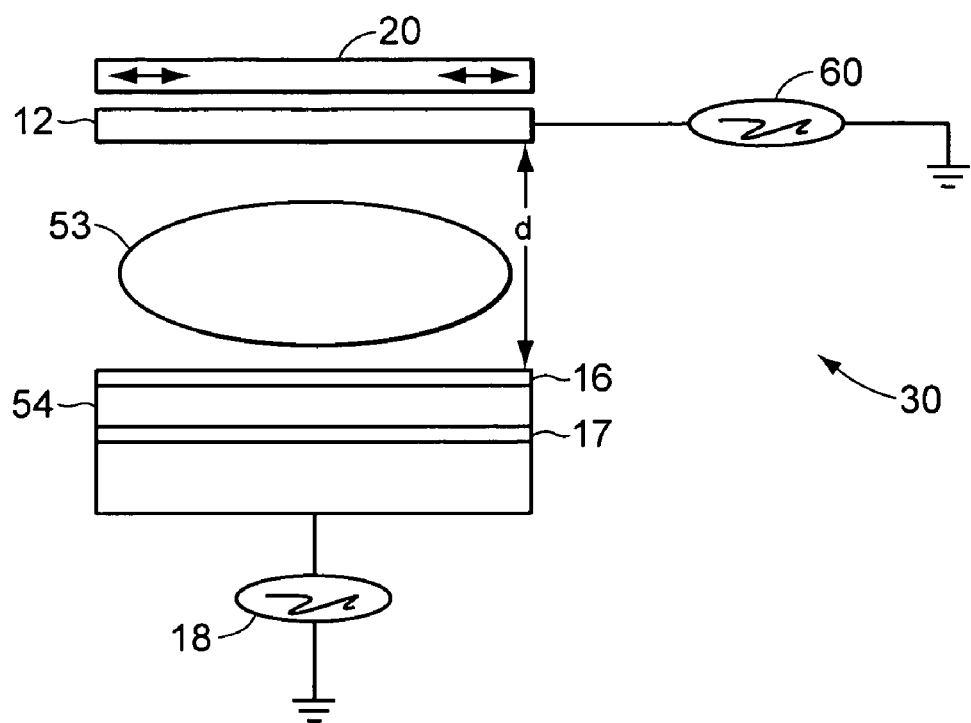
FIG. 1C illustrates an RF sputtering deposition apparatus.

In some embodiments, magnet 20 extends beyond area 52 in one direction, for example the Y direction in FIG. 2, so that scanning is necessary in only one direction, for example the X direction, to provide a time averaged uniform magnetic field. As shown in FIGS. 1A and 1B, magnet 20 can be scanned over the entire extent of target 12, which is larger than region 52 of uniform sputter erosion. Magnet 20 is moved in a plane parallel to the plane of target 12.

The combination of a uniform target 12 with a target area 52 larger than the area of substrate 16 can provide films of highly uniform thickness. Further, the material properties of the film deposited can be highly uniform. The conditions of sputtering at the target surface, such as the uniformity of erosion, the average temperature of the plasma at the target surface and the equilibration of the target surface with the gas phase ambient of the process are uniform over a region which is greater than or equal to the region to be coated with a uniform film thickness. In addition, the region of uniform film thickness is greater than or equal to the region of the film which is to have highly uniform optical properties such as index of refraction, density, transmission, or absorption.

In the present disclosure, target 12 can be formed from perovskite material, such as BST, for deposition of dielectric perovskite film. In some embodiments of the present invention the perovskite target is doped with transition metal dopants, for example Manganese, transition elements, lanthanides (including the rare earth ions) and/or amphotaric elements. In some embodiments of the present invention the percentage of the dopant in the perovskite target is from 0.1 to several percent.

In some embodiments of the invention, material tiles are formed. These tiles can be mounted on a backing plate to form a target for apparatus 10. A wide area sputter cathode target can be formed from a close packed array of smaller tiles. Target 12, therefore, may include any number of tiles, for example between 2 and 20 individual tiles. Tiles can be finished to a size so as to provide a margin of non-contact, tile to tile, less than about 0.010" to about 0.020" or less than half a millimeter so as to eliminate plasma processes that may occur between adjacent ones of tiles 30. The distance between tiles of target 12 and the dark space anode or ground shield 19 in FIG. 1B can be somewhat larger so as to provide non contact assembly or to provide for thermal expansion tolerance during process chamber conditioning or operation.

As shown in FIG. 1B, a uniform plasma condition can be created in the region between target 12 and substrate 16 in a region overlying substrate 16. A plasma 53 can be created in region 51, which extends under the entire target 12. A central region 52 of target 12 can experience a condition of uniform sputter erosion. As discussed further below, a layer deposited on a substrate placed anywhere below central region 52 can then be uniform in thickness and other properties (i.e., dielectric, optical index, or material concentrations). In addition, in region 52 the deposition provides uniformity of deposited film that can be larger than the area in which the deposition provides a film with uniform physical or optical properties such as chemical composition or index of refraction. In some embodiments, target 12 is substantially planar in order to provide uniformity in the film deposited on substrate 16. In practice, planarity of target 12 can mean that all portions of the target surface in region 52 are within a few millimeters of a planar surface, and can be typically within 0.5 mm of a planar surface.

Reactive gases that provide a constant supply of oxygen to keep the target surface oxidized can be provided to expand the process window. Some examples of the gases that can be utilized for controlling surface oxidation are $O_2$, water vapor, hydrogen, $N_2O$, fluorine, helium, and cesium. Additionally, a feedback control system can be incorporated to control the oxygen partial pressure in the reactive chamber. Therefore, a wide range of oxygen flow rates can be controlled to keep a steady oxygen partial pressure in the resulting plasma. Other types of control systems such as target voltage control and optical plasma emission control systems can also be utilized to control the surface oxidation of the target. In some embodiments, power to target 12 can be controlled in a feedback loop at supply 14. Further, oxygen partial pressure controller 20 can control either oxygen or argon partial pressures in plasma 53. In some embodiments of the present invention, oxygen flow or partial pressure can be utilized to maintain a constant voltage of discharge from target 12.

FIGS. 3A and 3B show a capacitor structure with a dielectric perovskite layer deposited according to some embodiments of the present invention. As shown in FIG. 3A, a dielectric perovskite layer 302 is deposited on a substrate 301. In some embodiments, the dielectric layer 302 can be patterned in various ways before deposition of a substrate 301. In some embodiments, a first electrode layer 303 can be deposited on the substrate and the dielectric layer 302 is deposited over the first electrode layer. The second electrode layer 304 is then deposited over the dielectric layer 302. In some embodiments of the invention, the dielectric perovskite layer 302 is crystalline and has sufficiently high dielectric constant without the necessity of a high temperature anneal. Therefore, substrate 301 can be a silicon wafer, titanium metal, alumina, or other conventional high temperature substrate, but may also be a low temperature material such as plastic, glass, or other material that may be susceptible to damage from the high temperature anneal. This feature can have the great advantage of decreasing the expense and weight of capacitor structures formed by the present invention. The low temperature deposition of perovskite material allows for successive depositions of perovskite and electrode layers, one upon another. Such a process would have the advantage that successive layers of capacitor structure would be obtained in a stacked condition without the inclusion of a substrate layer. The stacked layered capacitor would provide higher capacitance and higher energy storage than single layer devices with a smaller surface area. Additionally, a capacitor with a lower inductance can be obtained.

In accordance with the present invention, perovskite films can be deposited on substrate 302 with a pulsed-DC biased PVD system as was described above. In particular, an AKT 1600 PVD system can be modified to provide an RF bias and an Advanced Energy Pinnacle plus 10K pulsed DC power supply can be utilized to provide power to a target. The pulsing frequency of the power supply can vary from about 0 to about 350 KHz. The power output of the power supply is between 0 and about 10 kW.

A target of Barium Strontium Titanate with resistivity in the range of less than about megaohms can be utilized with high rate pulsed-dc sputtering. As discussed above, the target can be mounted on a monolithic backing plate as described in U.S. Provisional Application filed on Aug. 26, 2005 as Provisional Application No. 60/711,893 to which application Ser. No. 11/497,669 filed Aug. 1, 2006 and now abandoned claims parentage, which is also herein incorporated by reference in its entirety.

In general, target 12 can be a dielectric material having a resistivity of less than about a megaohm, and therefore can be described as a conducting ceramic target. Target 12, which is formed of a dielectric perovskite material that may not be inherently conducting, is made conducting by formulation so as to contain an excess of metallic composition or by addition of a dopant that provides sufficient conductivity. Examples of suitable dopants include boron, antimony, arsenic, phosphorous, or other dopants. In the example of a BST target, the sintering process can be conducted in the presence of a reducing ambient to achieve a sufficiently conductive target material. Utilization of a conducting ceramic target material can be sputtered at high rates utilizing reactive pulsed-DC techniques so as to form dense stoichiometric dielectric films.

Gas flows containing Oxygen and Argon can be utilized. In some embodiments, the Oxygen to Argon ratio ranges from 0 to about 50% with a total gas flow of between about 60 to about 80 sccm. The pulsing frequency ranges from about 200 kHz to about 350 kHz during deposition. RF bias can also be applied to the substrate. In many trials, the deposition rates varied from about 2 Angstrom/(kW sec) to about 1 Angstrom/(kW sec) depending on the $O_2$/Ar ratio as well as substrate bias.

FIG. 3A illustrates a layer of perovskite material 302 deposited on a thin substrate 301 according to some embodiments of the present invention. Substrate 301 can be formed of a thin metallic sheet (e.g., copper, titanium, stainless steel, or other suitable thin metallic sheet), can be formed of a high temperature plastic material, or may be formed of a ceramic, glass, or polymer material.

Figure 4A:
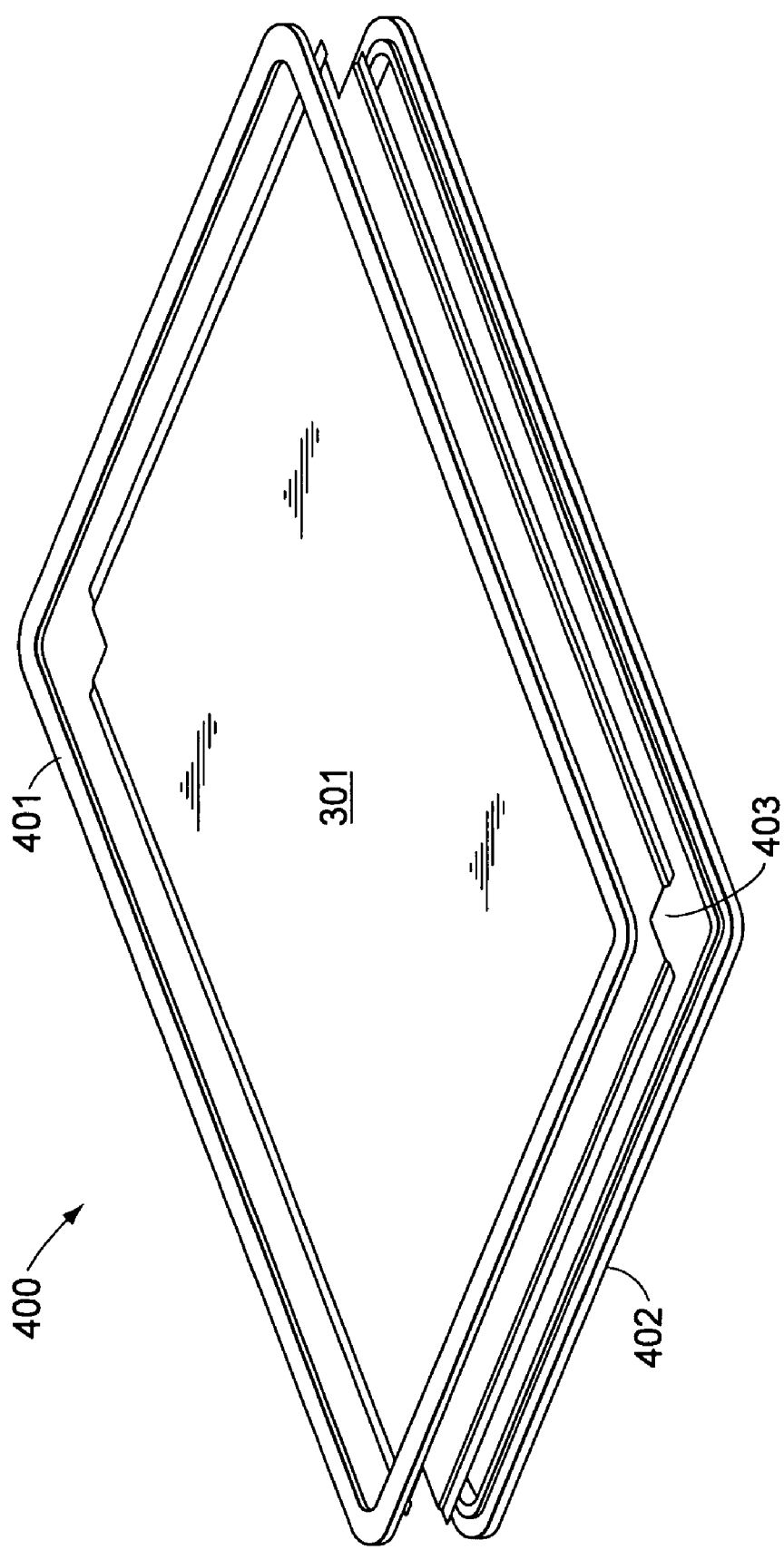
FIGS. 4A, 4B, 4C, and 4D illustrate a thin substrate mount and mask arrangement that can be utilized in the deposition of dielectric perovskite layers, for example BST films, deposited according to some embodiments of the present invention.
Figure 4B:
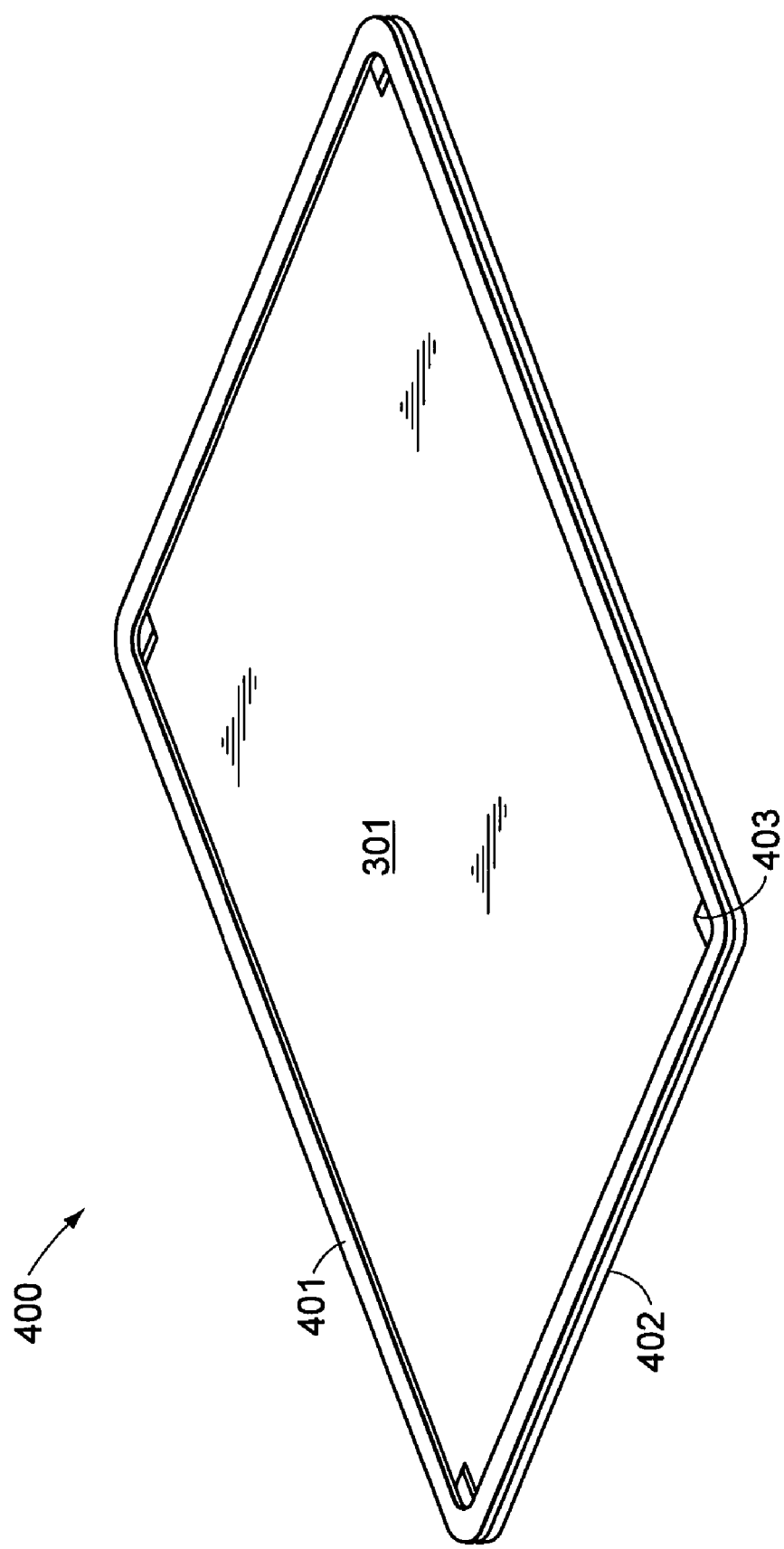

Depositing materials on a thin substrate involves holding and positioning the substrate during deposition. FIGS. 4A, 4B, 4C, and 4D illustrate a reusable fixture 400 for holding a thin film substrate. As shown in FIG. 4A, reusable fixture 400 includes a top portion 401 and a bottom portion 402 that are fastened together to secure the substrate. Thin substrate 301 is positioned between top portion 401 and bottom portion 402. As shown in FIG. 4B, top portion 701 and bottom portion 702 are such that substrate 301 is brought into a planar condition and subsequently clamped as top portion 401 is closed into bottom portion 402. Substrate 301 can be easily held by fixture 400 so that substrate 301 can be handled and positioned. In some embodiments, the corners of substrate 301, areas 403, are removed so that substrate 301 is more easily stretched by avoiding "wrap-around" corner clamping effects when top portion 401 is closed into bottom portion 402.

Figure 4C:
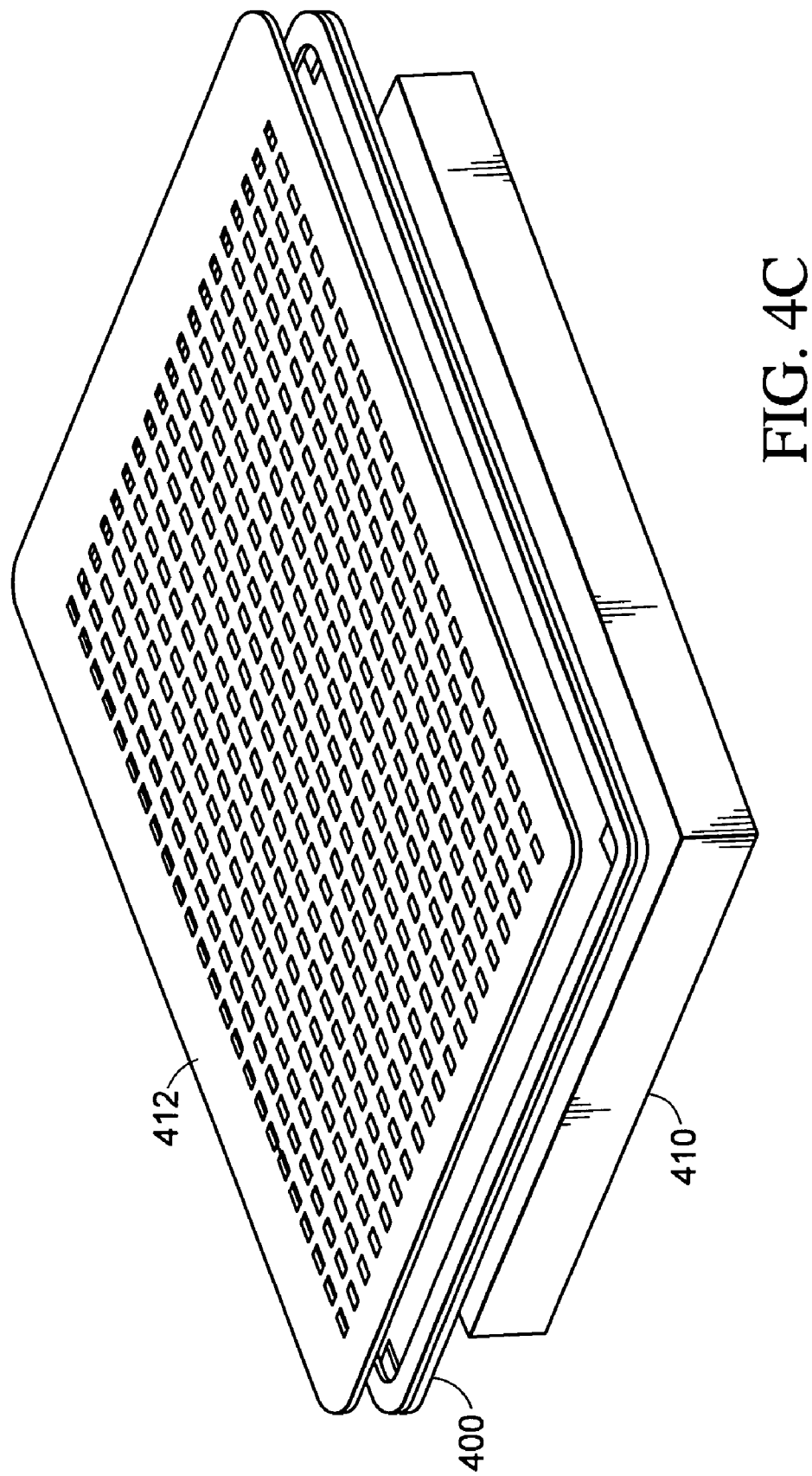

As shown in FIG. 4C, a mask 412 can be attached to fixture 400. In some embodiments, fixture 400 includes guides in order to align fixture 400 with respect to mask 412. In some embodiments, mask 412 may be attached to fixture 400 and travel with fixture 400. Mask 412 can be positioned at any desired height above substrate 301 in fixture 400. Therefore, mask 412 can function as either a contact or proximity mask. In some embodiments, mask 412 is formed of another thin substrate mounted in a fixture similar to fixture 400.

Figure 4D:
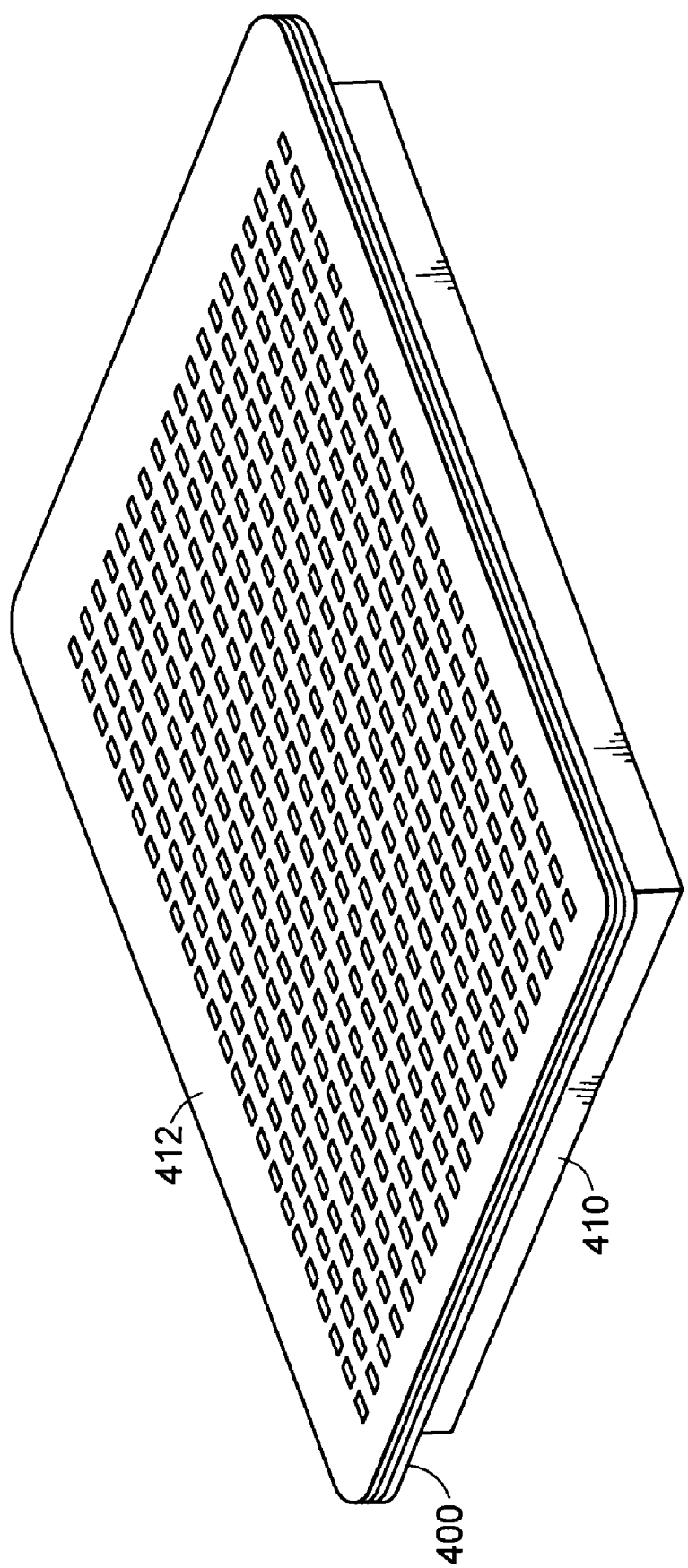

As shown in FIGS. 4C and 4D, fixture 400 and mask 412 can be positioned relative to mount 410. Mount 410, for example, can be a susceptor, mount, or an electrostatic chuck of a processing chamber such as that shown in FIGS. 1A and 1B. Fixture 400 and mask 412 can have features that allow for ready alignment with respect to each other and with respect to mount 410. In some embodiments, mask 412 is resident in the processing chamber and aligned with fixture 400 during positioning of fixture 400 on mount 410, as shown in FIG. 4D.

Utilizing fixture 400 as shown in FIGS. 4A, 4B, 4C, and 4D allows processing of a thin film substrate in a processing chamber. In some embodiments, thin film substrates can be about 1 µm or more. Further, thin film substrate 301, once mounted within fixture 400, can be handled and moved from process chamber to process chamber. Therefore, a multiprocessor chamber system can be utilized to form stacks of layers, including one or more layers of perovskite film deposited according to embodiments of the present invention.

Figure 5:
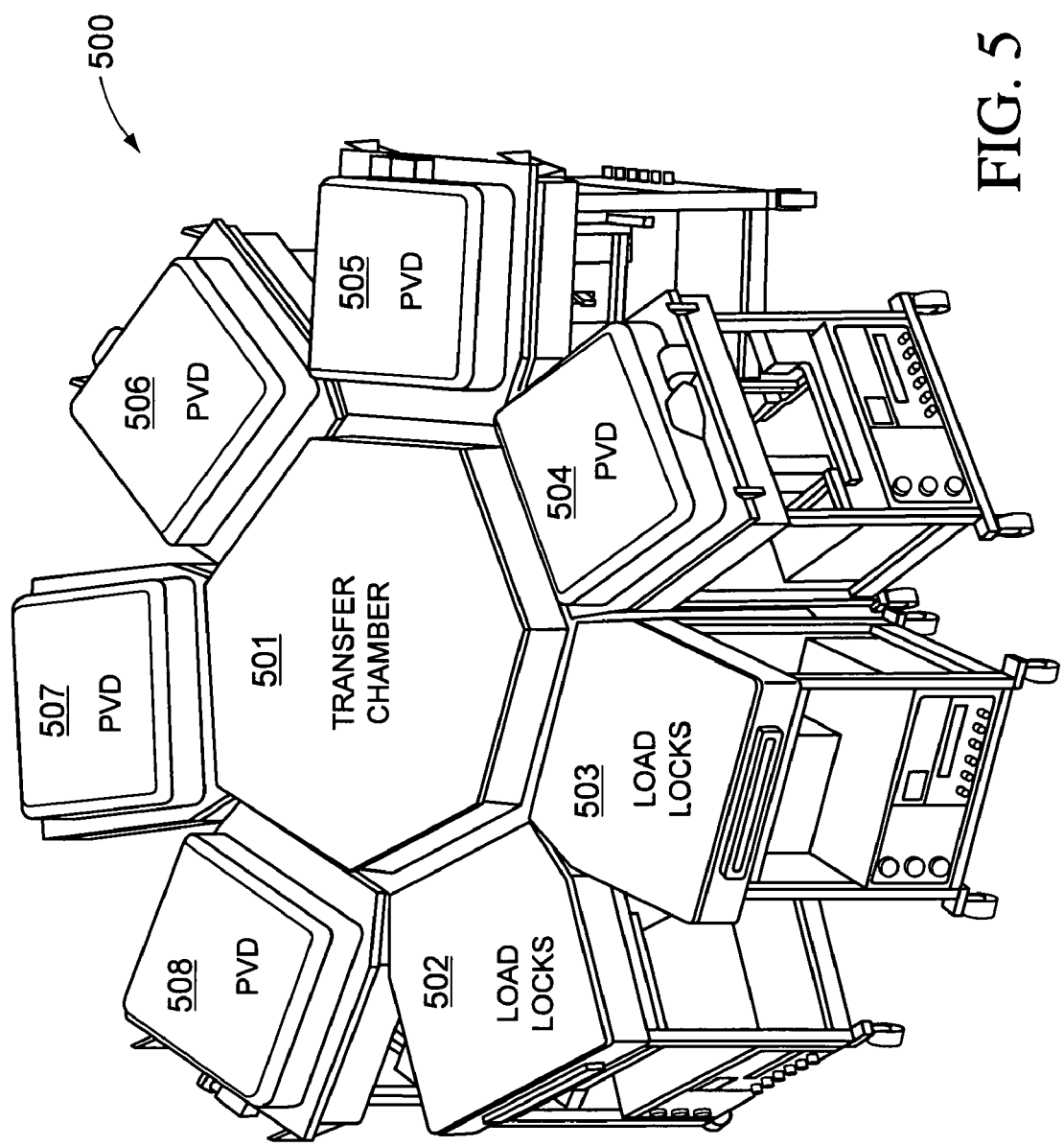
FIG. 5 illustrates a cluster tool that can be utilized to form batteries with dielectric perovskite layers deposited according to some embodiments of the present invention.

FIG. 5 illustrates a cluster tool 500 for processing thin film substrates. Cluster tool 500 can, for example, include load lock 502 and load lock 503, through which mounted thin film substrate 301 is loaded and a resultant device is removed from cluster tool 500. Chambers 504, 505, 506, 507, and 508 are processing chambers for depositions of materials, heat treatments, etching, or other processes. One or more of chambers 504, 505, 506, 507, and 508 can be a pulsed-DC or RF PVD chamber such as discussed above with respect to FIGS. 1A, 1B, and 1C and within which a dielectric perovskite film may be deposited according to embodiments of the present invention.

Processing chambers 504, 505, 506, 507, and 508 as well as load locks 502 and 503 are coupled by transfer chamber 501. Transfer chamber 501 includes substrate transfer robotics to shuttle individual wafers between processing chambers 504, 505, 506, 507, and 508 and load locks 502 and 503.

In production of a thin-film capacitor, substrates are loaded into load lock 503. An electrode layer can be deposited in chamber 504, followed by a perovskite deposition performed in chamber 505. The substrate can then be removed through load lock 503 for an in-air heat treatment external to cluster tool 500. The treated wafer can then be reloaded into cluster tool 500 through load lock 502. The wafer can then again be removed from cluster tool 500 for deposition of a second electrode layer, or sometimes chamber 506 can be adapted to deposition of the second electrode layer. The process can be repeated to form a capacitor stack. The finished capacitor structure is then off-loaded from cluster tool 500 in load lock 502. Wafers are shuttled from chamber to chamber by robotics in transfer chamber 501.

A capacitor structure produced according to the present invention could utilize thin film substrates loaded in a fixture such as fixture 400. Fixture 400 is then loaded into load lock 503. Chamber 504 may still include deposition of the electrode layer. Chamber 505 then includes deposition of a perovskite layer according to embodiments of the present invention. A second electrode layer can then be deposited in chamber 506. In this process, only low temperature anneal is utilized to increase crystallinity and the dielectric constant of the perovskite layer.

Another advantage of a thin film capacitor process is the ability to stack capacitor structures. In other words, substrates loaded into cluster tool 500 may traverse process chambers 504, 505, 506, 507, and 508 multiple times in order to produce multiply stacked capacitor structures. FIGS. 6A and 6B illustrate such structures.

FIG. 6A illustrates a parallel coupled stacking. As shown in FIG. 6A, a substrate 301, which for example can be a high temperature plastic substrate, such as polyimide, is loaded into load lock 503. Electrode layer 303, for example, can be deposited in chamber 504. A dielectric perovskite layer 302 is then deposited on electrode layer 303. Perovskite layer 302 can be about 0.1 to 1 µm and can be deposited in chamber 505 according to embodiments of the present invention. The wafer can then be moved to chamber 506 where the next electrode layer 304 of thickness of about 0.1 µm or more is deposited. A second capacitor stack can then be deposited over the first capacitor stack formed by first electrode layer 303, perovskite layer 302, and second electrode layer 304. This capacitor stack includes second perovskite layer 305 and third electrode layer 306. In some embodiments, further stacks can be formed. In some embodiments, metal layers 303, 304, and 306 differ in the mask utilized in deposition so that tabs are formed for electrical coupling of layers.

As discussed above, any number of individual capacitor stacks can be formed such that parallel capacitor formations are formed. Such a parallel arrangement of capacitor stacking structure can be formed of alternating layers of electrode and perovskite dielectric layers and can have any number of dielectric layers.

To form the structures shown in FIG. 6, substrates are rotated again through the chambers of cluster tool 500 in order to deposit the multiple sets of capacitors. In general, a stack of any number of capacitors can be deposited in this fashion.

Tables I and II illustrate some examples depositions of perovskite material, for example BST, according to the present invention. In these examples, the BST film is deposited using an AKT-1600 PVD (400×500 mm substrate size) system from Applied Komatsu. The power supply is an ENI 13.56 MHz RF power supply with a ENI matchbox. The target material is BST with resistivity in the range of k$\Omega$s or less. The target material can, for example, be sintered. Silicon wafers are used for initial experiments. 0.1-1 microns of BST films are deposited on Si wafers with various bottom electrode materials such as: n++ Si, Ir, Pt, $IrO_2$ and also $Ti_4O_7$, $Ti_3O_5$, Nb, Os. The Oxygen to Argon ratio ranges from 0 to 50%. Process pressure ranges from 3-10 mT. RF bias is applied to substrates for some of the examples. The dielectric constant of as deposited film range from 13 to 123 and increases after post-deposition anneal to more than 1000.

One skilled in the art will recognize variations and modifications of the examples specifically discussed in this disclosure. These variations and modifications are intended to be within the scope and spirit of this disclosure. As such, the scope is limited only by the following claims.

TABLE 1

| Example # | Film Thickness (nm) | Target Power (W)r | Bias Power (W) | Ar/O$_2$ Ratio | Vbd | Ebd | C (PF) | Dielectric Constant |
|---|---|---|---|---|---|---|---|---|
| BST 2 | 3679 | 1500 | 100 | 50/50 | 157 | 4.267464 | 167 | 13.35 |
| BST 3 | 3736 | 1500 | 100 | 50/50 | 150 | 4.014989 | 168 | 13.64 |
| BST3-N++ 550c | 3736 | 1500 | 100 | | 40 | 1.070664 | 1670 | 135.57 |
| BST-Pt-1 | 2282 | 1500 | 100 | 50/25 | 47 | 2.059597 | 299.5 | 14.85 |
| BST Pt-1 550C | 2282 | 1500 | 100 | | 16 | 0.701139 | 5722 | 283.74 |
| BST-n++-4 | 2282 | 1500 | 100 | 50/25 | 120 | 5.258545 | 274 | 13.59 |
| BST-n++550c | 2282 | 1500 | 100 | | 30 | 1.314636 | 1970 | 97.69 |
| BST-IrO2-1 | 2310 | 1500 | 100 | 50/25 | 100 | 4.329004 | 296.2 | 14.87 |
| BST-IrO2-1 750C | 2310 | | | 50/25 | 2.4 | 0.103896 | 17700 | 888.46 |
| BST-Pt-2 | 2310 | 1500 | 100 | 50/25 | 100 | 4.329004 | 319 | 16.01 |
| BST-Pt-2 650C | 2310 | | | | 9.4 | 0.406926 | 9750 | 489.41 |
| BST-Pt-3 | 2199 | 1500 | 100 | 75/25 | 7 | 0.318327 | 2580 | 123.28 |
| BST-Pt-3 550 | 2199 | 1500 | 100 | 75/25 | 11.2 | 0.509322 | 10740 | 513.20 |
| BST IrO2-2 | 2199 | 1500 | 100 | 75/25 | 16.7 | 0.759436 | 378 | 18.06 |
| BST IrO2-2 550 | 2199 | 1500 | 100 | 75/25 | 1.4 | 0.063665 | 10400 | 496.95 |
| BST Ir02-2 650 | 2199 | 1500 | 100 | 75/25 | 6.9 | 0.313779 | 11000 | 525.62 |
| BST IrO2-2 750 | 2199 | | | 75/25 | 1.4 | 0.063665 | 21950 | 1048.85 |
| BST Pt 1 step | 2918 | 2000 | 0 | 50/50 | | | 1239 | 78.56 |
| BST Ir 1 step | 2918 | 2000 | 0 | 50/50 | | | 1180 | 74.82 |
| BST IrO2 1 step | 2918 | 2000 | 0 | 50/50 | | | 567 | 35.95 |
| BST Pt 2 steps | 1689 | 2000 | 0 | 100/0–50/50 | | | 1220 | 44.78 |
| BST Ir 2 steps | 1689 | 2000 | 0 | 100/0–50/50 | | | 1230 | 45.14 |
| BST IrO2 2 steps | 1689 | 2000 | 0 | 100/0–50/50 | | | 684 | 25.10 |

TABLE II

| Sample# | thickness | target power | bias power | Ar/O2 | dep time (sec) | Vbd | Ebd | C (PF) | Dielectric Constant, k | Vbd (V) | C (PF) | Dielectric Constant, k (after 500 C. ° anneal) |
|---|---|---|---|---|---|---|---|---|---|---|---|---|
| ALDOEN++-1 | 840.4 | | | | | 70 | 8.329367 | 380 | 6.939418 | | | |
| | 840.4 | | | | | | | 377 | 6.884633 | | | |
| ALDOEN++-2 | 5767.2 | | | | | | | 60.5 | 7.581825 | | | |
| experiment 109 | 1000 | | | | | | | 1200 | 0 | | | |
| | | | | | | | | 1200 | 26.07562 | | | |
| | 840 | | | | | 75 | 8.928571 | 405 | 7.392438 | | | |
| ebonex, BST (A) | 1140 | 900 | 100 | | 3600 | | 0 | | 0 | | | |
| Ir Coated #2 | 2220 | 900 | 0 | 50/50 | 5400 | | 0 | 508 | 24.50587 | | 16800 | 810.4302 |
| | | | | | | | | | | | 5000 | |
| | 2220 | | | | | | | | | | 21530 | 1038.605 |
| IrO2 Coated #2 | 2220 | 900 | 0 | 50/50 | 5400 | | 0 | 365 | 17.60756 | 9 | 22000 | 1061.278 |
| | 2220 | | | | | | 0 | | | | 20000 | 964.7979 |
| | | | | | | | | | | | 19000 | |
| | | | | | | | | | | | 9000 | |
| N++(1) | 2220 | 900 | 0 | | 5400 | 12 | 0.540541 | 290 | 13.98957 | 12 | 2512 | 121.1786 |
| N++(2) | 840 | 900 | 100 | 50/50 | 5400 | 10 | 1.190476 | 982 | 17.92438 | 10 | 2675 | 48.8266 |
| N++(3) | can't meas | 900 | 200 | | 5400 | | | 377 | | | | |
| N++(4) | 1490 | 900 | 100 | 50/25 | 5400 | | 0 | 242 | 7.835289 | | 537 | 17.38657 |
| Ti4O7 (A) | 910 | 900 | | 50/50 | | | 0 | 3030 | 59.91525 | | 450 | 8.898305 |
| | 910 | | | | | | | 2962 | 58.57062 | | | |
| | 910 | | | | | | | 2860 | 56.55367 | | | |
| Ti4O7 (B) | 1490 | | | 50/25 | | | 0 | 1988 | 64.36593 | | 314 | 10.16645 |
| | 1490 | | | | | | | 2048 | 66.30856 | | | |
| Ir # 3 | 650 | 900 | 1000 sec no bias/ 4400 sec bias 80 W | 50/50 | 5400 | | | very leaky | | | | |
| Ir #4 | 870 | 900 | 500 sec no bias/ 4900 sec 50 w bias | 50/50 | 5400 | | | very leaky | | | | |
| Ir #5 | 2000 | 900 | 1500 sec no bias/ 5700 sec 50 W bias | 50/50 | 7200 | | | very leaky | | | | |
| IrO2 (Tsub = 450c) | 2000 | 900 | no bias | 50/50 | 5400 | 10 | 0.5 | 1390 | 60.40852 | 10 | 5972 | 259.5393 |
| | 2000 | | | | | | | | | | 6021 | 261.6688 |

TABLE II-continued

| Sample# | thickness | target power | bias power | Ar/O2 | dep time (sec) | Vbd | Ebd | C (PF) | Dielectric Constant, k | Vbd (V) | C (PF) | Dielectric Constant, k (after 500 C. ° anneal) |
|---|---|---|---|---|---|---|---|---|---|---|---|---|
| n++ (6) (Tsub = 450c) | 934 | 900 | 75 w bias | 50/50 | 7200 | 12 | 1.284797 | 870 | 17.65711 | 12 | 2857 | 57.98431 |
| n++ (7) (room) | 2541 | 900 | no bias | 50/50 | 5400 | | | 219 | | 13 0.512 | 2210 | 122.0254 |
| n++(8) (room) | 2504 | 900 | 75 w bias | 50/50 | 7200 | | | 224 | 12.18809 | 22 0.879 | 2218 | 120.6839 |
| n++ (9) (room) | 10000 | | 75 w bias | 50/50 | 28800 | | | 58 | 12.60322 | 55 0.55 | 954.7 | 207.4533 |
| n++ (10) (room) | 5000 | | 75 w bias | 50/50 | 14400 | | | | | | | |

What is claimed is:

1. A method of depositing a crystalline perovskite layer on a substrate, comprising:
    placing the substrate into a reactor;
    flowing a gaseous mixture through the reactor;
    providing pulsed DC power to a conducting ceramic target in the reactor through a narrow band rejection filter such that a voltage on the conducting ceramic target alternates between positive and negative voltages, wherein the conducting ceramic target is formed of a perovskite material and is positioned opposite the substrate;
    providing, to the substrate, an RF bias power that corresponds to the narrow band rejection filter, wherein the crystalline perovskite layer is formed on the substrate without high temperature annealing.

2. The method of claim 1 further including filtering the pulsed-DC power to protect a pulsed DC power supply from a bias power while allowing passage of the pulsed DC power through the filter.

3. The method of claim 1, further including applying RF power to the conducting ceramic target.

4. The method of claim 1, wherein the perovskite layer is a barium strontium titanate (BST) layer.

5. The method of claim 1, wherein the formed crystalline perovskite layer is more than about 0.1 micron thick.

6. The method of claim 1 wherein the formed crystalline perovskite layer is less than about 1 micron thick.

7. The method of claim 1, further comprising annealing the crystalline perovskite layer formed on the substrate.

8. The method of claim 7 wherein annealing the crystalline perovskite layer includes heating the crystalline perovskite layer to an anneal temperature of between about 500° C. and about 800° C.

9. The method of claim 1, further comprising preheating the substrate before applying power to the conducting ceramic target.

10. The method of claim 9, wherein preheating the substrate includes heating the substrate to a temperature of about 400° C. for low temperature perovskite deposition.

11. The method of claim 1, wherein the substrate is a low temperature substrate.

12. The method of claim 11, wherein the low temperature substrate is one of a set of substrates including glass, plastic, metal foil, copper, and stainless steel.

13. The method of claim 1 wherein the conducting ceramic target is doped with one or more of a transition metal dopant, transition element, lanthanide, and/or amphotaric elements.

14. The method of claim 13 wherein the conducting ceramic target is doped with Manganese.

15. The method of claim 14 wherein a level of Manganese in the conducting ceramic target is at least 0.1%.

16. The method of claim 1, wherein the conducting ceramic target is a perovskite target with a resistance of less than a megaohm.

17. A capacitor structure, comprising:
    a first conducting electrode layer;
    a crystalline dielectric perovskite layer deposited over the first conducting electrode layer, wherein the crystalline dielectric perovskite layer is formed without high temperature annealing by depositing a crystalline perovskite film in a pulsed DC reactive ion process with substrate bias, wherein a conducting ceramic target receives alternating negative and positive voltages from a narrow band rejection filter based on a frequency associated with the substrate bias; and
    a second conducting electrode layer deposited over the crystalline dielectric perovskite layer.

18. The capacitor of claim 17, wherein the first conducting electrode layer is a copper sheet.

19. A stacked capacitor structure, comprising:
    one or more capacitor stacks deposited on a substrate, wherein each capacitor stack comprises:
    a bottom electrode layer,
    a crystalline dielectric perovskite layer deposited over the bottom electrode layer without annealing, wherein the crystalline dielectric perovskite layer is formed by depositing a crystalline perovskite film in a pulsed DC reactive ion process with substrate bias, wherein a conducting ceramic target receives alternating negative and positive voltages from a narrow band rejection filter based on a frequency associated with the substrate bias, and
    a top electrode layer deposited over the one or more capacitor stacks.

20. The stacked capacitor structure of claim 19, wherein the capacitor stacks form a parallel stacked capacitor structure.

21. The stacked capacitor structure of claim 19, wherein the capacitor stacks form a series stacked capacitor structure.

22. A method of producing a capacitor, comprising:
    loading a substrate into a cluster tool;
    depositing a crystalline dielectric perovskite layer over a substrate without high temperature annealing in a chamber of the cluster tool, wherein the crystalline dielectric perovskite layer is formed by depositing a crystalline perovskite film in a pulsed DC reactive ion process with substrate bias, wherein a conducting ceramic target receives alternating negative and positive voltages from a narrow band rejection filter based on a frequency associated with the substrate bias.

23. The method of claim 22, wherein depositing the crystalline dielectric perovskite layer includes depositing a crystalline perovskite film with an RF sputtering PVD process.

24. The method of claim 22, wherein depositing the crystalline dielectric perovskite layer includes depositing the crystalline perovskite material through a mask.

25. The method of claim 22, further including
depositing a bottom electrode layer on the substrate wherein the crystalline dielectric perovskite layer is deposited over the bottom electrode layer.

26. The method of claim 22, further including depositing a top electrode layer over the dielectric perovskite layer.

* * * * *